US012593704B2

(12) United States Patent
Wang et al.

(10) Patent No.: US 12,593,704 B2
(45) Date of Patent: Mar. 31, 2026

(54) THREE-DIMENSIONAL SEMICONDUCTOR DEVICE AND METHOD

(71) Applicant: Taiwan Semiconductor Manufacturing Co., Ltd., Hsinchu (TW)

(72) Inventors: Jeng-An Wang, Hsinchu (TW); Sheng-Chi Lin, Yilan County (TW); Hao-Cheng Hou, Hsinchu (TW); Tsung-Ding Wang, Tainan (TW); Chien-Hsun Lee, Chu-tung Town (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 516 days.

(21) Appl. No.: 18/152,558

(22) Filed: Jan. 10, 2023

(65) Prior Publication Data

US 2024/0105631 A1     Mar. 28, 2024

Related U.S. Application Data

(60) Provisional application No. 63/377,373, filed on Sep. 28, 2022.

(51) Int. Cl.
| | |
|---|---|
| *H01L 23/538* | (2006.01) |
| *H01L 21/48* | (2006.01) |
| *H01L 21/56* | (2006.01) |
| *H01L 21/683* | (2006.01) |

(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01);
(Continued)

(58) Field of Classification Search
CPC ............ H01L 23/5389; H01L 21/4853; H01L 21/4857; H01L 21/565; H01L 21/568; H01L 21/6835; H01L 23/3128; H01L 23/5383; H01L 23/5386; H01L 24/19; H01L 24/20; H01L 2221/68372; H01L 2224/214; H01L 24/81; H01L 24/16; H01L 21/563; H01L 2221/68327; H01L 25/0655; H01L 25/50; H01L 24/32; H01L 23/49816; H01L 2221/68345; H01L 2221/68359
USPC ........................................................ 257/668
See application file for complete search history.

(56) References Cited

U.S. PATENT DOCUMENTS

| | | | |
|---|---|---|---|
| 6,975,036 B2 * | 12/2005 | Ohuchi | H01L 21/6835 257/E21.511 |
| 7,521,122 B2 * | 4/2009 | Noro | B32B 27/38 438/460 |
| 8,993,380 B2 | 3/2015 | Hou et al. | |

(Continued)

FOREIGN PATENT DOCUMENTS

| | | |
|---|---|---|
| TW | 201101399 A | 1/2011 |

*Primary Examiner* — Vu A Vu
(74) *Attorney, Agent, or Firm* — Slater Matsil, LLP

(57) ABSTRACT

Embodiments provide a method of performing a carrier switch for a device wafer, attaching a second wafer and removing a first wafer. A buffer layer is deposited over the device wafer, buffer layer reducing the topography of the surface of the device wafer. After the carrier switch a film-on-wire layer is removed from the buffer layer and then the buffer layer is at least in part removed.

20 Claims, 22 Drawing Sheets

(51) Int. Cl.
  *H01L 23/00* (2006.01)
  *H01L 23/31* (2006.01)
(52) U.S. Cl.
  CPC .... *H01L 24/20* (2013.01); *H01L 2221/68372* (2013.01); *H01L 2224/214* (2013.01)

(56)            References Cited

U.S. PATENT DOCUMENTS

| | | | |
|---|---|---|---|
| 9,087,796 B2 * | 7/2015 | Adam | H10D 86/011 |
| 9,209,247 B2 | 12/2015 | Colinge et al. | |
| 9,236,267 B2 | 1/2016 | De et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,412,817 B2 | 8/2016 | Yang et al. | |
| 9,412,828 B2 | 8/2016 | Ching et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,461,029 B2 * | 10/2016 | Jang | H01L 24/92 |
| 9,472,618 B2 | 10/2016 | Oxland | |
| 9,496,189 B2 | 11/2016 | Yu et al. | |
| 9,502,265 B1 | 11/2016 | Jiang et al. | |
| 9,502,322 B2 * | 11/2016 | Hu | H05K 3/28 |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,666,502 B2 | 5/2017 | Chen et al. | |
| 9,735,131 B2 | 8/2017 | Su et al. | |
| 9,799,529 B2 * | 10/2017 | Yen | H10D 84/0158 |
| 10,515,904 B2 * | 12/2019 | Lin | H01L 23/49805 |
| 10,529,698 B2 * | 1/2020 | Yu | H01L 23/481 |
| 10,600,708 B2 * | 3/2020 | Tsai | H01L 24/17 |
| 12,112,999 B2 * | 10/2024 | Costa | H01L 23/3128 |
| 2009/0236686 A1 | 9/2009 | Shim et al. | |
| 2012/0049344 A1 | 3/2012 | Pagaila et al. | |
| 2012/0168962 A1 | 7/2012 | Yang et al. | |
| 2012/0273960 A1 | 11/2012 | Park et al. | |
| 2017/0148755 A1 | 5/2017 | Scanlan et al. | |

* cited by examiner

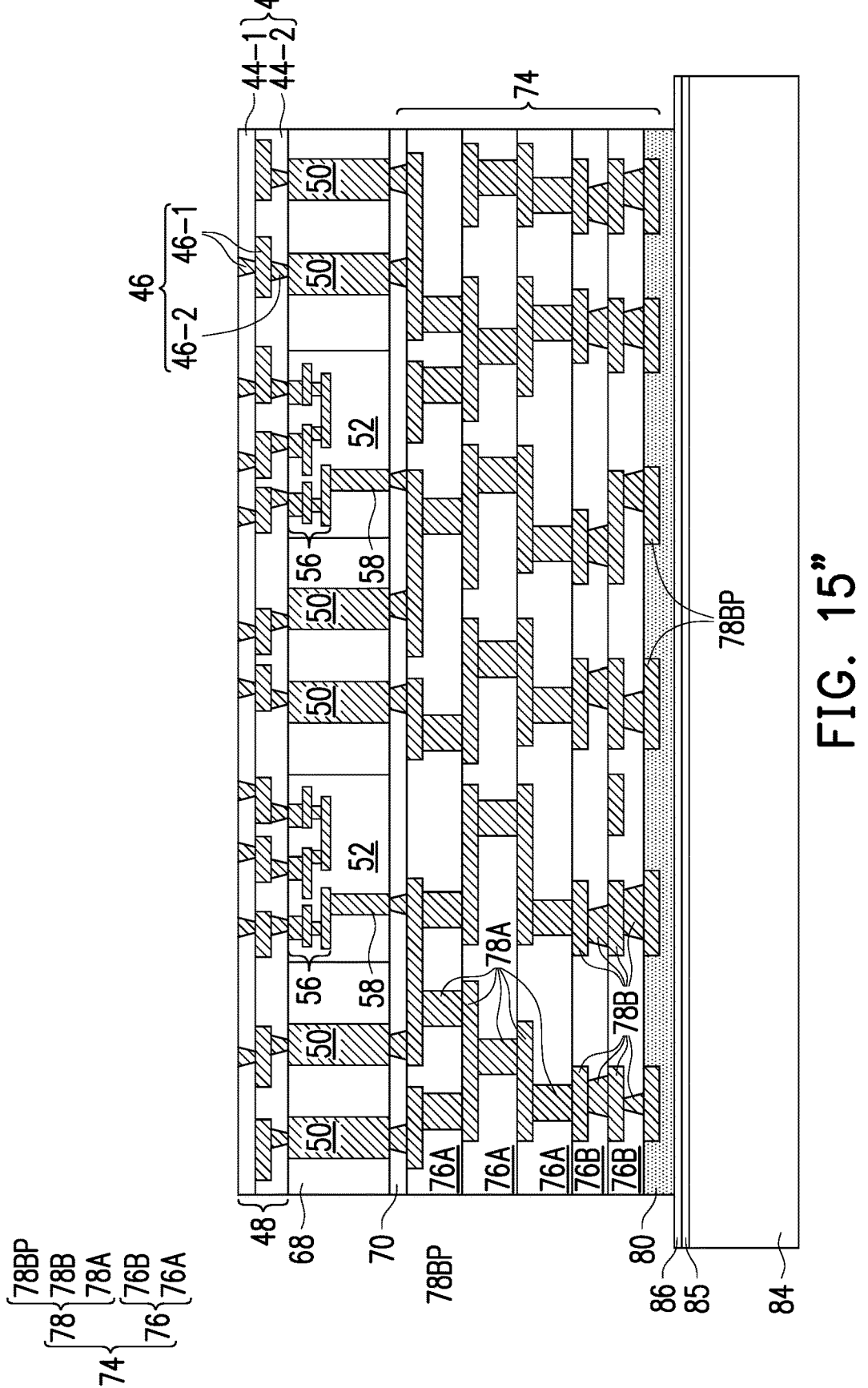
FIG. 15"

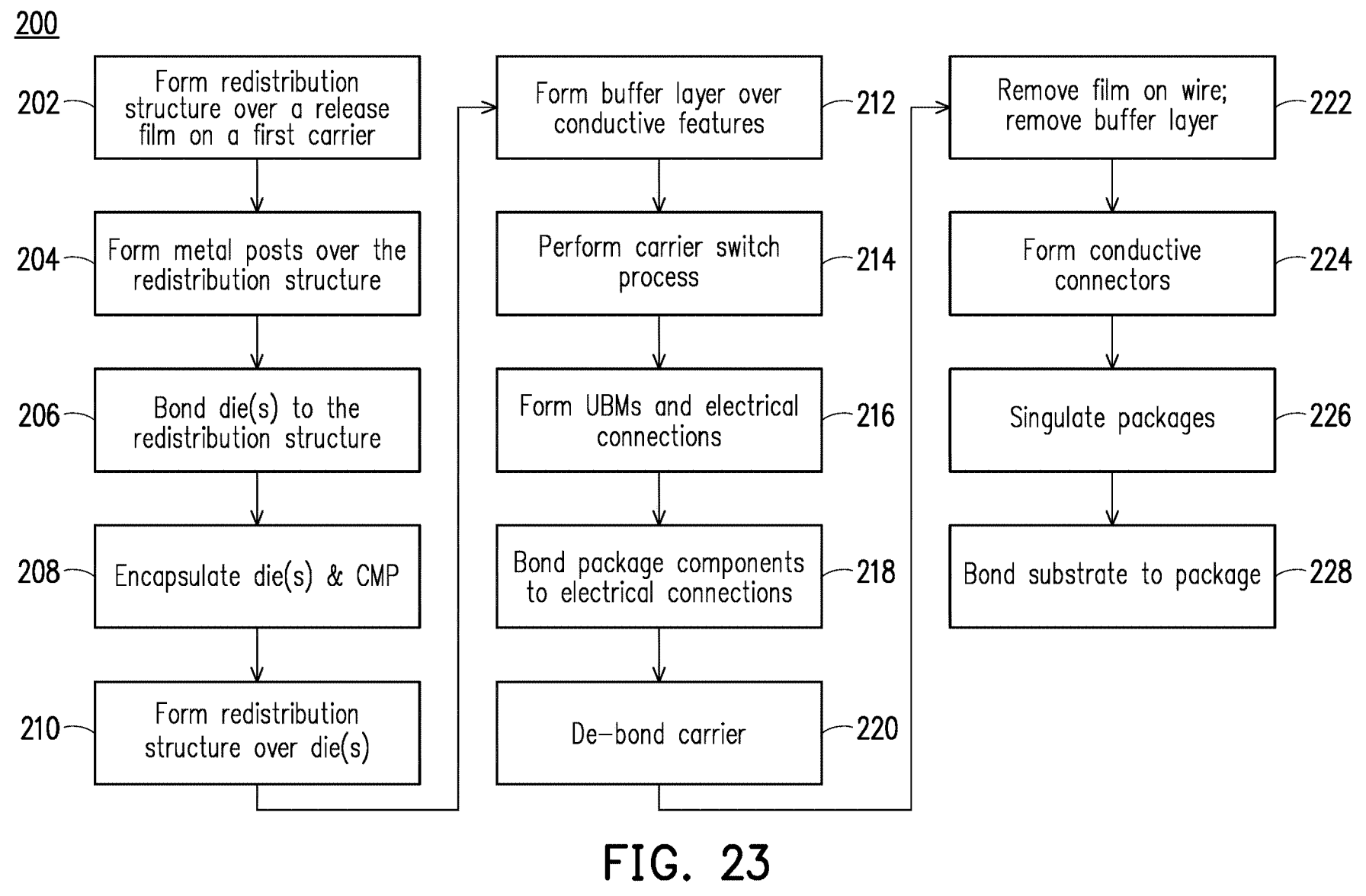

200

202 — Form redistribution structure over a release film on a first carrier

204 — Form metal posts over the redistribution structure

206 — Bond die(s) to the redistribution structure

208 — Encapsulate die(s) & CMP

210 — Form redistribution structure over die(s)

212 — Form buffer layer over conductive features

214 — Perform carrier switch process

216 — Form UBMs and electrical connections

218 — Bond package components to electrical connections

220 — De-bond carrier

222 — Remove film on wire; remove buffer layer

224 — Form conductive connectors

226 — Singulate packages

228 — Bond substrate to package

FIG. 23

THREE-DIMENSIONAL SEMICONDUCTOR DEVICE AND METHOD

PRIORITY CLAIM AND CROSS-REFERENCE

This application claims the benefit of U.S. Provisional Application No. 63/377,373, filed on Sep. 28, 2022, and entitled "Chip-on-Wafer-on-Substrate (CoWoS) Package," which is hereby incorporated herein by reference.

BACKGROUND

Integrated circuit applications currently have increasingly more functions built therein, and are thus formed to be increasingly larger. Accordingly, many types of packages have been developed to suit to customized requirements of integrated circuits. Power networks are also built inside the packages to provide power to the device dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15', 15", and 15''' illustrate variations on the formation of a three-dimensional package, in accordance with some embodiments.

FIG. 23 illustrates a flow diagram of a process of forming a three-dimensional package, in accordance with some embodiments.

DETAILED DESCRIPTION

Figures 1, 2:
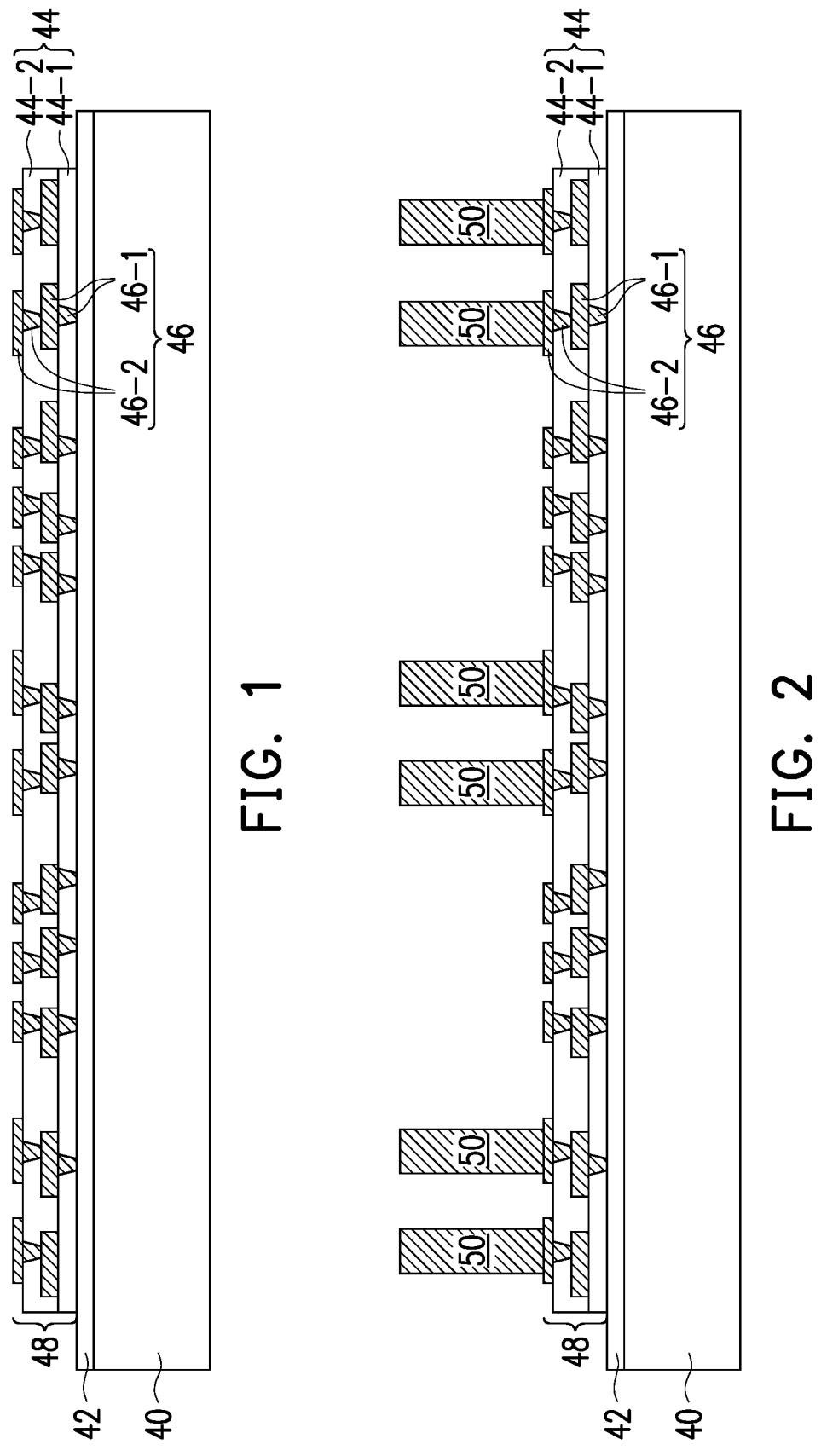
FIGS. 1-18, 19A, 19B, 19C, 19D, 19E, 19F, and 20-22 illustrate various views of intermediate stages in the formation of a three-dimensional package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional device, such as a chip-on-wafer-on-substrate device, may be used to create a package device using various compatible components. One process of using this technique builds an interposer device on a carrier substrate. As part of the interposer, upper sub-underbump metallurgies may be formed. Then the interposer is flipped over and the back side of the interposer may have devices attached thereto. The flipping over may utilize a carrier switch process which attaches the front of the interposer to a second carrier, then debonds the first carrier and flips the structure over for further processing, such as attaching additional devices, packages, or chips thereto. When the second carrier is attached, generally a thick adhesive may be used to do the attachment because a combination of the upper sub-underbump metallurgies and the upper surface of the dielectric layer of the interposer creates a large topography for the upper surface of the interposer. Then, when the thick adhesive is removed, the interposer may be damaged inadvertently.

Embodiments provide a buffer layer deposited over the sub-underbump metallurgies which smooths the upper surface topography. As a result, the adhesive may be much thinner and then, when it is later removed, the buffer layer helps protect the sub-underbump metallurgies.

FIGS. 1 through 22 illustrate the intermediate stages in the formation of a package including an interposer die in accordance with some embodiments. FIG. 1 illustrates the formation of release film 42 on carrier 40. Carrier 40 may be a glass carrier, a silicon wafer, an organic carrier, or the like. Carrier 40 may have a round top-view shape in accordance with some embodiments. Release film 42 may be formed of a polymer-based material and/or an epoxy-based thermal-release material (such as a Light-To-Heat-Conversion (LTHC) material), which is capable of being decomposed under radiation such as a laser beam, so that carrier 40 may be de-bonded from the overlying structures that will be formed in subsequent processes. In accordance with some embodiments, release film 42 is applied on carrier 40 through coating.

A redistribution structure 48, which includes a plurality of dielectric layers 44 and a plurality of Redistribution Lines (RDLs) 46, is formed over the release film 42. The respective process is illustrated as process 202 in the process flow 200 as shown in FIG. 23. As shown in FIG. 1, a first dielectric layer 44-1 is formed on release film 42. In accordance with some embodiments, dielectric layer 44-1 is formed of or comprises an organic material, which may be a polymer. The organic material may also be a photo-sensitive material. For example, dielectric layer 44-1 may be formed of or comprises polyimide, PBO, BCB, or the like.

A first plurality of RDLs 46 (denoted as 46-1) are formed on dielectric layer 44 1. The formation of RDLs 46-1 may include patterning dielectric layer 44-1 to form via openings, forming a metal seed layer (not shown) over dielectric layer 44-1 and extending into the via openings, forming a patterned plating mask (not shown) such as a photoresist over the metal seed layer, and then performing a metal plating process to deposit a metallic material on the exposed metal seed layer. The patterned plating mask and the portions of the metal seed layer covered by the patterned plating mask are then removed, leaving RDLs 46-1 as shown in FIG. 1. In accordance with some embodiments, the metal seed layer includes a titanium layer and a copper layer over the titanium layer. The metal seed layer may be formed using, for example, PVD or a like process. The plating process may be performed using, for example, an electrochemical plating process or an electro-less plating process.

FIG. 1 further illustrates the formation of additional dielectric layer(s) 44-2 and additional RDLs (such as RDLs 46-2), for example. Throughout the description, dielectric layers 44-1 and 44-2 are individually and collectively referred to as dielectric layers 44, and RDLs 46-1 and 46-2 are individually and collectively referred to as RDLs 46. In accordance with some embodiments, dielectric layer 44-2 is first formed on RDLs 46-1. The bottom surface of dielectric layer 44-2 is in contact with the top surfaces of RDLs 46-1 and dielectric layer 44-1. Dielectric layer 44-2 may be formed of or comprise an organic dielectric material, which may be a polymer. For example, dielectric layer 44-2 may comprise a photo-sensitive material such as PBO, polyimide, BCB, or the like. Dielectric layer 44-2 is then patterned to form via openings (occupied by the via portions of RDLs 46-2) therein. Hence, some portions of RDLs 46-1 are exposed through the openings in dielectric layer 44-2.

Next, RDLs 46-2 are formed on dielectric layer 44-2 to connect to RDLs 46-1. RDLs 46-2 include via portions (also referred to as vias) extending into the openings in dielectric layer 44-2, and trace portions (metal line portions, or RDL lines) over dielectric layer 44-2. The formation of RDLs 46-2 may be similar to the formation of RDLs 46-1. Each of the vias may have a tapered profile, with the upper portions being wider than the corresponding lower portions.

After the formation of RDLs 46-2, there may be more dielectric layers and the corresponding RDLs formed, with the upper RDLs over and landing on the respective lower RDLs. The materials of the more dielectric layers may be selected from the same group (or different group) of candidate materials as dielectric layers 44-1 and 44-2, which candidate materials may include a polymer such as polyimide, PBO, BCB, or the like. Dielectric layers 44 and RDLs 46 collectively form redistribution structure 48.

Referring to FIG. 2, after the formation of redistribution structure 48, metal posts 50 may be formed. The respective process is illustrated as process 204 in the process flow 200 as shown in FIG. 23. The formation of metal posts 50 may include depositing a metal seed layer over RDLs 46, and forming a patterned plating mask, through which some portions of the metal seed layer are exposed. A plating process is then performed to plate a metallic material into the openings in the plating mask. The plating mask is then removed, followed by the etching of the exposed portions of the metal seed layer to form metal posts 50 (which will eventually become through-vias 50).

Figures 3, 4:
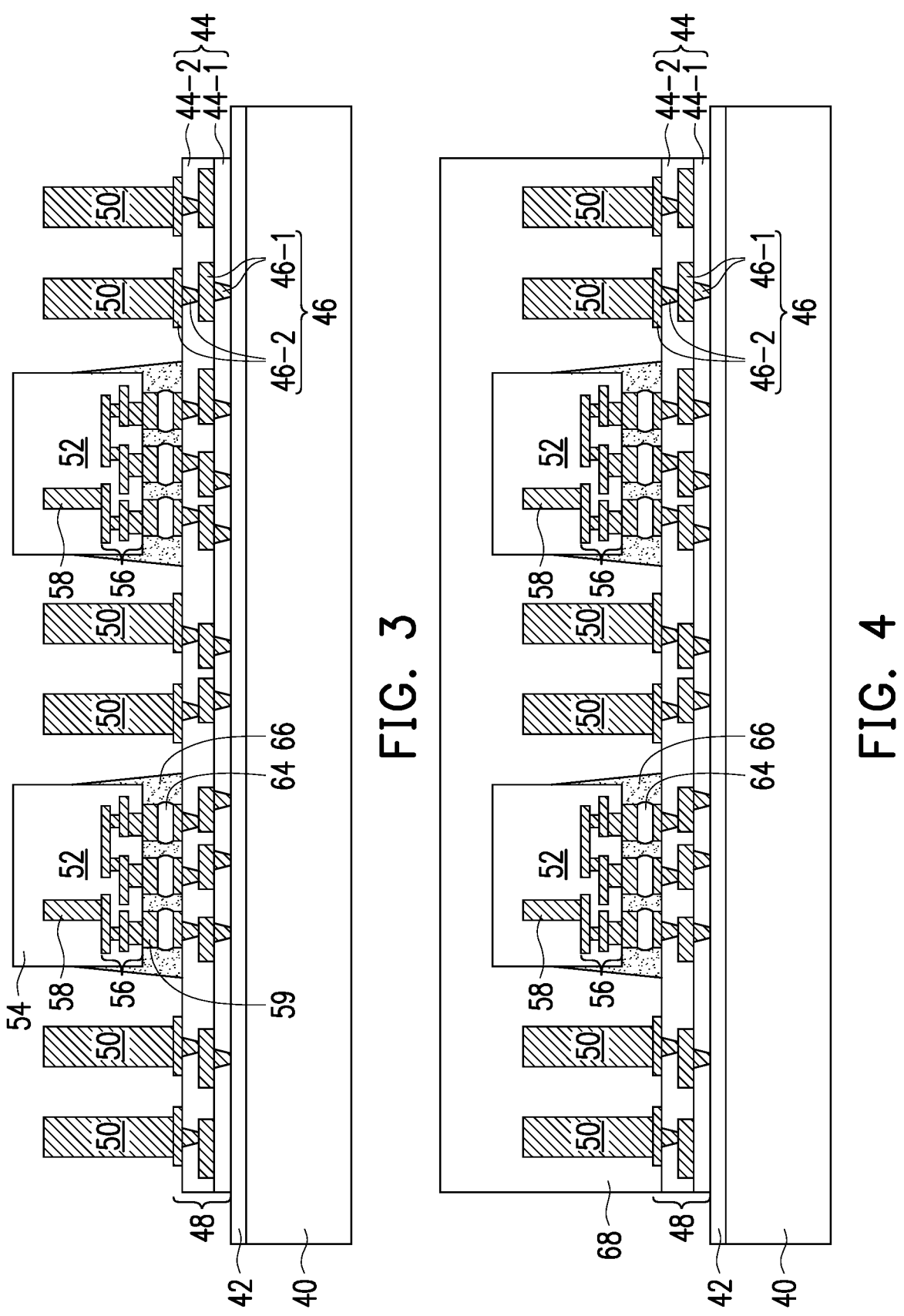

FIG. 3 illustrates the bonding of a plurality of dies to RDLs 46. The respective process is illustrated as process 206 in the process flow 200 as shown in FIG. 23. The bonded dies may include discrete dies 52. Discrete die 52 represents one or more of passive device dies, interconnect dies, and or the like that may be bonded in this process. For example, discrete die(s) 52 may include an Independent Passive Device (IPD) die including a capacitor therein, an IPD die including a resistor therein, a Local Silicon Interconnect (LSI) die for bridging two device dies, and/or the like.

FIG. 3 illustrates an example discrete die 52 in accordance with some embodiments. It is appreciated that discrete die 52 represents some of the possible structures of discrete dies, and may include one or more of features such as through-vias, interconnect paths, capacitors, and the like. Die 52 may include substrate 54, which may be a semiconductor substrate such as a silicon substrate. Substrate 54 may also be a dielectric substrate, which is formed of a dielectric material such as silicon oxide, silicon nitride, or the like. In accordance with some embodiments, there is no through-via formed to extend into, regardless of whether substrate 54 is formed of a semiconductor or a dielectric material. In accordance with alternative embodiments, through-vias 58 are formed to extend into substrate 54.

In accordance with some embodiments, discrete die 52 is free from active devices such as transistors and diodes therein. Discrete die 52 may or may not include passive devices such as capacitors, transformers, inductors, resistors, and the like. For example, discrete die 52 may be an integrated passive device (IPD) die including an interconnect.

Discrete die 52 may act as a bridge die, and may include interconnect structure 56 over substrate 54. Interconnect structure 56 further includes dielectric layers and metal lines and vias in the dielectric layers. The dielectric layers may include Inter-Metal Dielectric (IMD) layers. In accordance with some embodiments, some of the dielectric layers are formed of low-k dielectric materials having dielectric constant values (k-value) lower than 3.8, and the k-values may be lower than about 3.0 or about 2.5. The low-k dielectric layers may be formed of a carbon-containing low-k dielectric material, Hydrogen SilsesQuioxane (HSQ), MethylSilsesQuioxane (MSQ), or the like. The formation of the metal lines and vias may include single damascene and dual damascene processes. Bond structures 59 such as metal pillars or metal pads are formed at the surface of discrete die 52.

Referring back to FIG. 3, in accordance with some embodiments, the bonding of discrete die 52 to RDLs 46 may be performed through solder bonding or metal-to-metal direct bonding. For example, the bonding may be performed through solder regions 64. After the bonding, underfill 66 is dispensed into the gaps between discrete dies 52 and their corresponding underlying RDLs 46, and is then cured. In accordance with some embodiments, the underfill 66 may include a base material, which may include a polymer, a resin, an epoxy, and/or the like, and filler particles in the base material. The filler particles may be dielectric particles of silica, alumina, boron nitride, or the like, and may have spherical shapes.

Referring to FIG. 4, an encapsulant 68 is dispensed to encapsulate discrete die 52 and metal posts 50 therein. The respective process is illustrated as process 208 in the process flow 200 as shown in FIG. 23. Encapsulant 68 fills the gaps between neighboring metal posts 50 and discrete dies 52. Encapsulant 68 may include a molding compound, a molding underfill, an epoxy, and/or a resin. When the encapsulation is finished, the top surface of encapsulant 68 is higher than the top ends of metal posts 50 and the top surfaces of discrete die 52. Encapsulant 68 may include a base material, which may be a polymer, a resin, an epoxy, or the like, and filler particles in the base material. The filler particles may be dielectric particles of silica, alumina, boron nitride, or the like, and may have spherical shapes.

Figures 5, 6:
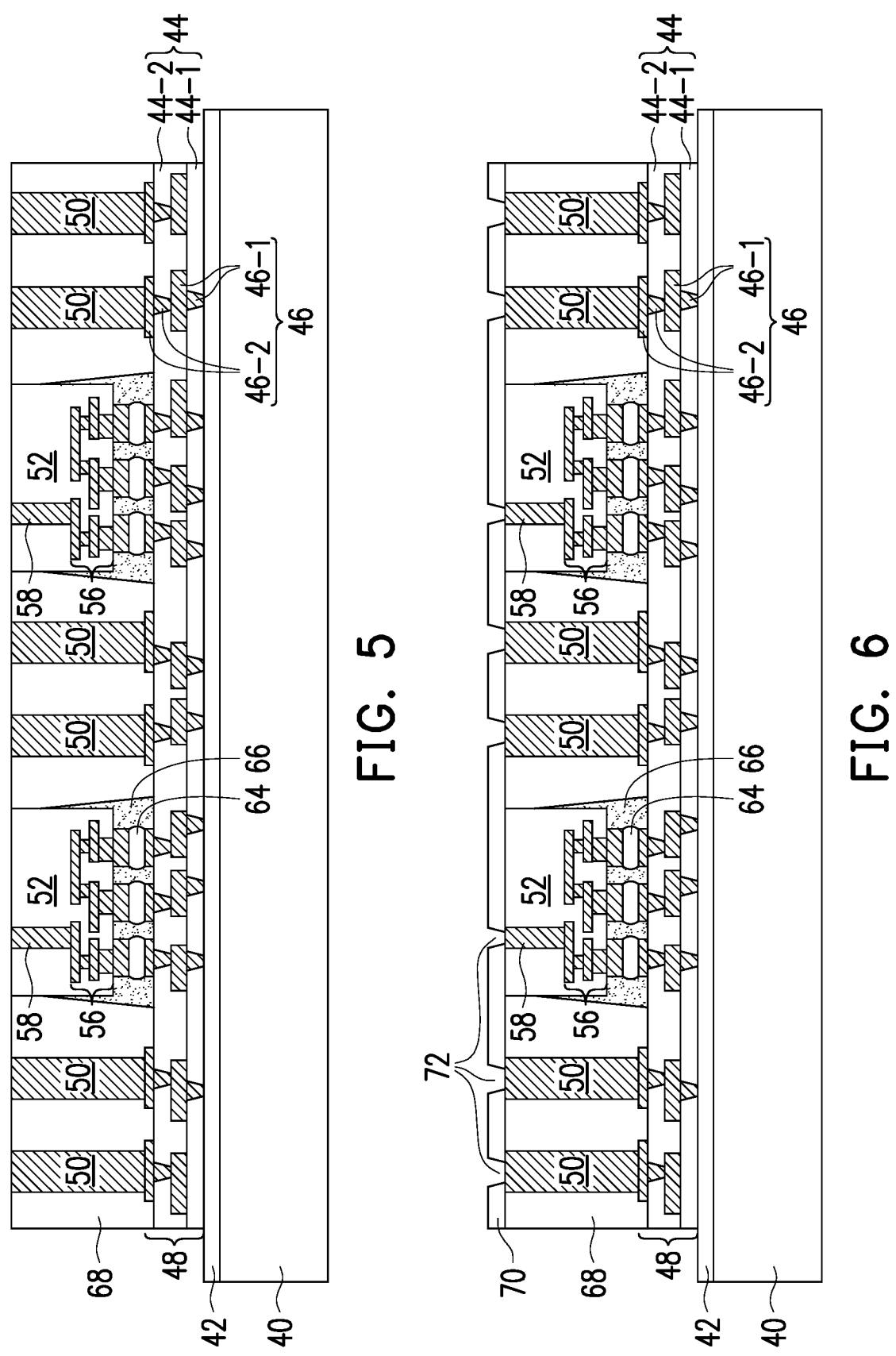

In FIG. 5, a planarization process such as a Chemical Mechanical Polish (CMP) process or a mechanical grinding process is then performed to thin encapsulant 68 and discrete dies 52, until metal posts 50 are revealed. Metal posts 50 are alternatively referred to as through-vias 50 hereinafter since they penetrate through encapsulant 68. In accordance with some embodiments in which discrete dies 52 includes through-vias 58, the substrates of the discreate dies 52 are thinned from bottom, and through-vias 58 are also revealed by the planarization process.

Due to the planarization process, the filler particles, which may be spherical particles, in encapsulant 68 are also polished. Accordingly, the polished spherical particles become partial spherical particles, which include planar top surfaces and rounded bottom surfaces. The planar top surfaces are coplanar with the top surface of the base material in encapsulant 68.

FIG. 6 illustrates the formation and the patterning of dielectric layer 70 in accordance with some embodiments. Dielectric layer 70 may be or may comprise an organic material such as a polymer, which may be a photo-sensitive polymer such as PBO, polyimide, or the like. Dielectric layer 70 may also be formed of or comprise an inorganic material such as silicon oxide, silicon nitride, or the like. Dielectric layer 70 is patterned to form openings 72, with through-vias 50 and 58 being exposed through openings 72. When through-vias 58 are formed in discrete die 52, an isolation dielectric layer (not shown) may be (or may not be) formed in discrete die 52, with the dielectric layer contacting the back surface of semiconductor substrate 54 (shown in FIG. 28). The isolation dielectric layer may be formed of or comprise silicon oxide, silicon nitride, or the like.

Figure 7:
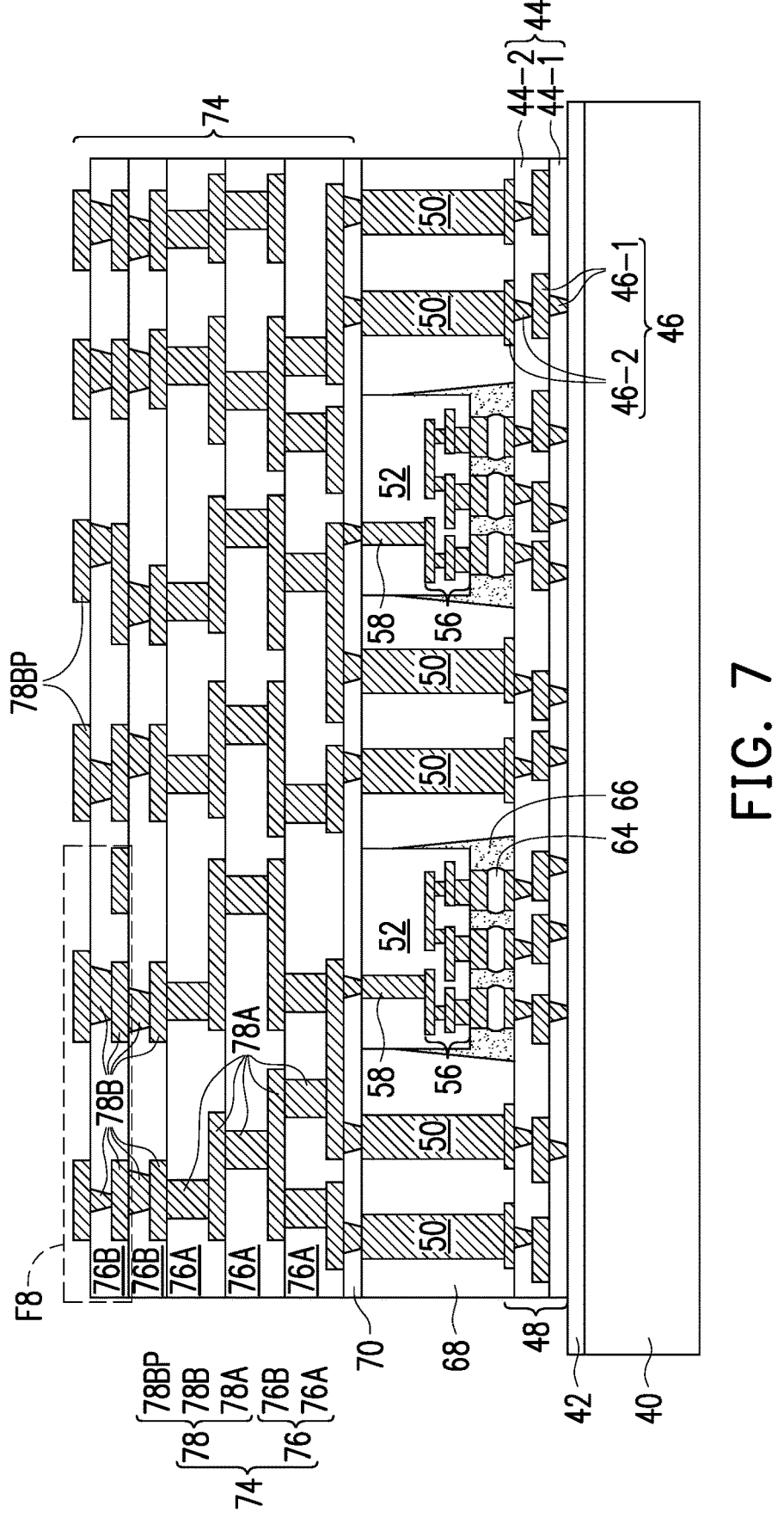

FIG. 7 illustrates the formation of redistribution structure 74 over discrete die 52. The respective process is illustrated as process 210 in the process flow 200 as shown in FIG. 23. In accordance with some embodiments, redistribution structure 74 includes dielectric layers 76A and dielectric layers 76B over dielectric layers 76A. Dielectric layers 76A and dielectric layers 76B may be formed of different materials and have different thicknesses. For example, each or some of the dielectric layers 76A may be thicker than each or some of the dielectric layers 76B. In accordance with some embodiments, dielectric layers 76A are formed of a non-photo-sensitive material such as molding compound, molding underfill, silicon oxide, silicon nitride, or the like. Dielectric layers 76B, on the other hand, may be formed of a photo-sensitive material(s) such as PBO, polyimide, or the like. In accordance with alternative embodiments, both of dielectric layers 76A and 76B are formed of photo-sensitive material(s).

RDLs 78A are formed in dielectric layers 76A, and RDLs 78B are formed in dielectric layers 76B. In accordance with some embodiments, RDLs 78A are thicker and/or wider than RDLs 78B, and may be used for long-range electrical routing, while RDLs 78B may be used for short-range electrical routing. RDLs 78A and 78B are electrically connected to through-vias 50 and through-vias 58. Some surface conductive features 78BP are formed, which may be parts of RDLs 78B, or may be separately formed Under-Bump Metallurgies (UBMs). In some embodiments, the conductive features 78B may be considered sub-underbump metallurgies.

In accordance with some embodiments, RDLs 78A and 78B are electrically connected to redistribution structure 48 through through-vias 50. In accordance with alternative embodiments, through-vias 50 are not formed. Accordingly, all of the connections of RDLs 78A and 78B to redistribution structure 48 are made through through-vias 58 in discrete die 52. Since through-vias 58 may be formed smaller than through-vias 50, more interconnection can be made. In accordance with yet alternative embodiments, the electrical connections of RDLs 78A and 78B to redistribution structure 48 are made through both of through-vias 58 in discrete die 52 and through-vias 50.

Figures 8, 9:
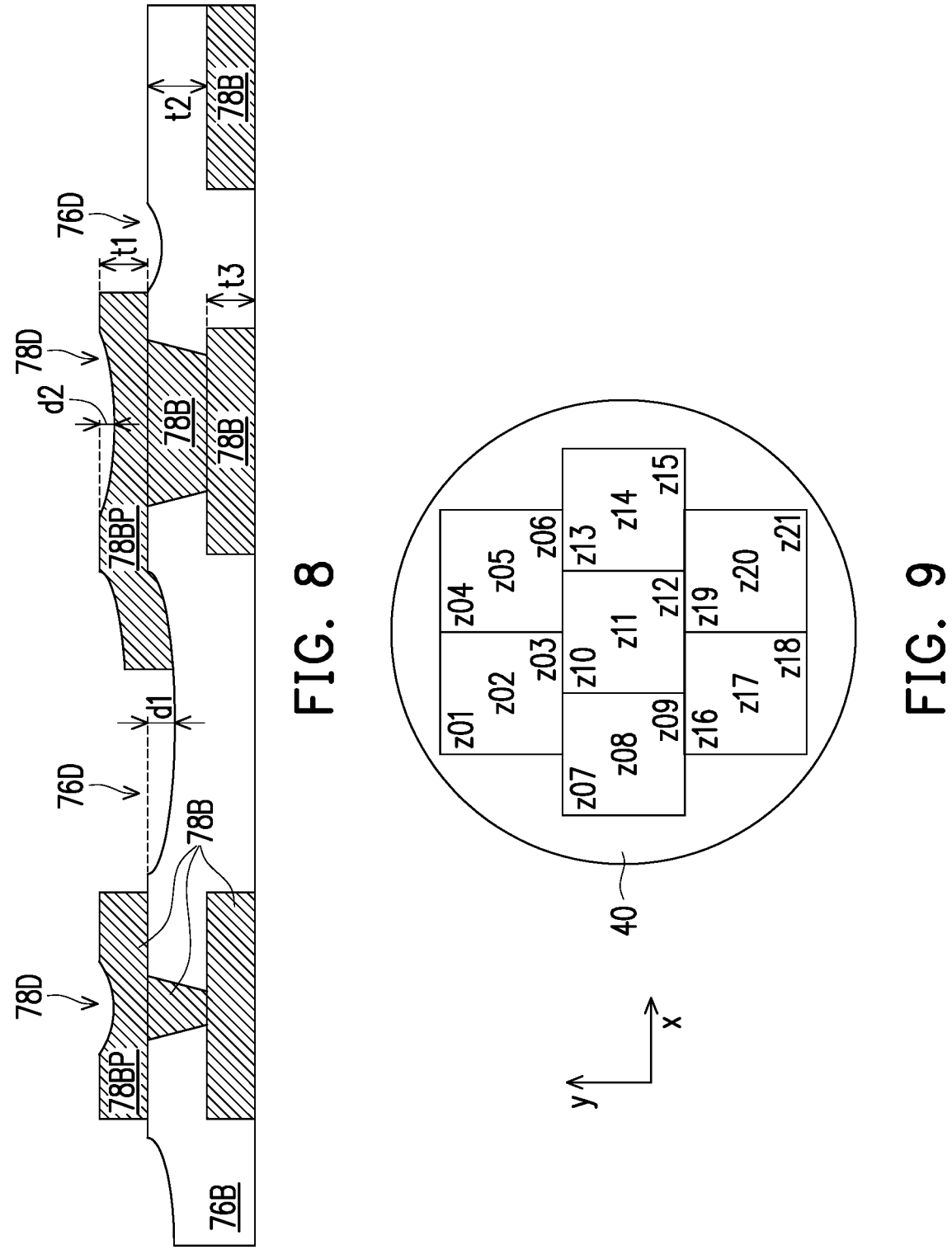

FIG. 8 illustrates an enlarged view of the box labeled F8 of FIG. 7. As shown in FIG. 8, the topography of the upper surface of the redistribution structure 74 (FIG. 7) may have large variation due to the underlying RDLs 78B projecting through the dielectric layers 76 (FIG. 7) and due to the thickness of the overlying conductive features 78BP. For example, with regard to the dielectric layers 76, the distance d1 corresponds to a depression 76D in the uppermost surface of the dielectric layer 76B. In some embodiments, the distance d1 may be between about 5 and 9 µm, such as about 7 µm. With regard to the conductive features 78BP, the thickness t1 of the conductive features 78BP protrudes from the upper surface of the dielectric layers 76. The topography is understood as being the distance that elements at the upper surface—the dielectric layer 76B and the conductive features 78BP—project vertically from a lowest point of the upper surface. The total topography can vary then, by as much as the distance d1+t1, where d1 and t1 are the maximal values across the surface of the structure.

Depressions 78D may also form in uppermost surfaces of the uppermost the RDLs 78B (i.e., conductive features 78BP) due to the deposition of underlying via portion of the RDLs 78B filling the corresponding opening in the dielectric layer 76B, causing the opening to project into the upper surfaces of the conductive features 78BP. Thus, the depressions 78D align to the via portions of the RDLs 78B. The distance d2 of the depressions 78D may be between about 5 and 12 µm, such as about 10 µm. A thickness t1 of the conductive features 78BP protrudes from the upper surface of the dielectric layers 76, further contributing to the topography variation of the upper surface of the redistribution structure 74.

The thickness t2 corresponds to the thickness of the dielectric layer 76B that covers the RDLs 78B. The thickness t3 corresponds to the thickness of the RDLs 78B. In some embodiments, the ratio of the thickness t2 to the thickness t3 may be between about 1:1 or 3:2, though other values may be used. For example, the thickness t2 may be between about 7 µm and about 12 µm and the thickness t3 may be between about 5 µm and about 10 µm. The thickness t1 of the conductive features 78BP may be greater than the thickness of the line portion of the RDLs 78B. In some embodiments, the ratio of the thickness t1 to the thickness t2 may be between about 3:2 and about 3:1, though other values may be used. For example, the thickness t1 may be between about 10 µm and about 20 µm and the thickness t2 may be between about 7 µm and about 12 µm.

Turning to FIG. 9, FIG. 9 illustrates a topography map of a workpiece (e.g., carrier 40 with distinct package areas formed thereon) which includes the structure illustrated in FIG. 7. Various z-direction (orthogonal to x-y plane) measurements may be taken across the surface of the workpiece and an average topography measurement may be calculated based on each of the measurements. The topography measurement may be the vertical distance of an uppermost surface of a feature in the region to a reference line representing the lowest point of the upper surface of the redistribution structure 74 in the region. In some embodiments, the average topography may be between about 15 µm and about 25 µm, such as between about 20 µm and about 24 µm with the minimum topography measurement being 0 µm and the maximum topography measurement being between about 25 µm and 35 µm. For example, sample values for z01, z02, z03, z04, z05, z06, z07, z08, z09, z10, z11, z12, z13, z14, z15, z16, z17, z18, z19, z20, and z21 in various regions may be (µm) 27.2, 18.8, 30.4, 20.1, 19.3, 25.2, 23.2, 20.6, 28.1, 23.6, 19.3, 29.0, 20.6, 17.5, 24.3, 21.3, 16.4, 25.1, 23.2, 17.6, and 21.5, respectively, for an average topography of 22.6 and maximum of 30.4. It should be understood that these values are merely samples and that values vary based on the implemented design.

Due to the topography variation, to perform a carrier-switch process—that is, to attach an upper carrier to the upper surface of the structure, flip the structure over, and remove the bottom carrier—a film-on-wire (FoW) adhesive is used between the upper carrier and the upper surface of the redistribution structure 74. The FoW layer serves as an adhesive and buffering layer to even out the topography of the upper surface of the structure. Because the topography variation is large, the FoW layer thickness would need to be quite thick to account for the variation and to provide additional buffer between the uppermost conductive feature 76BP and the upper carrier. When this upper carrier is eventually removed in a subsequent process, the FoW layer which remains on the structure (for example, in the depressions 76D and 78D) is also removed to expose the conductive features 76BP. A dry etch, for example, may be used to remove the FoW layer, however, due to the large topography differences, removing the FoW layer runs a significant risk to also remove a large portion of the upper dielectric layer 76B and either expose the RDLs 78B in the upper layer of the redistribution structure 74 or cause the upper dielectric layer 76B over the RDLs 78B to become so thin as to reduce the protective function of the upper dielectric layer 76B or cause electrical capacitance or leakage issues.

Figure 10:
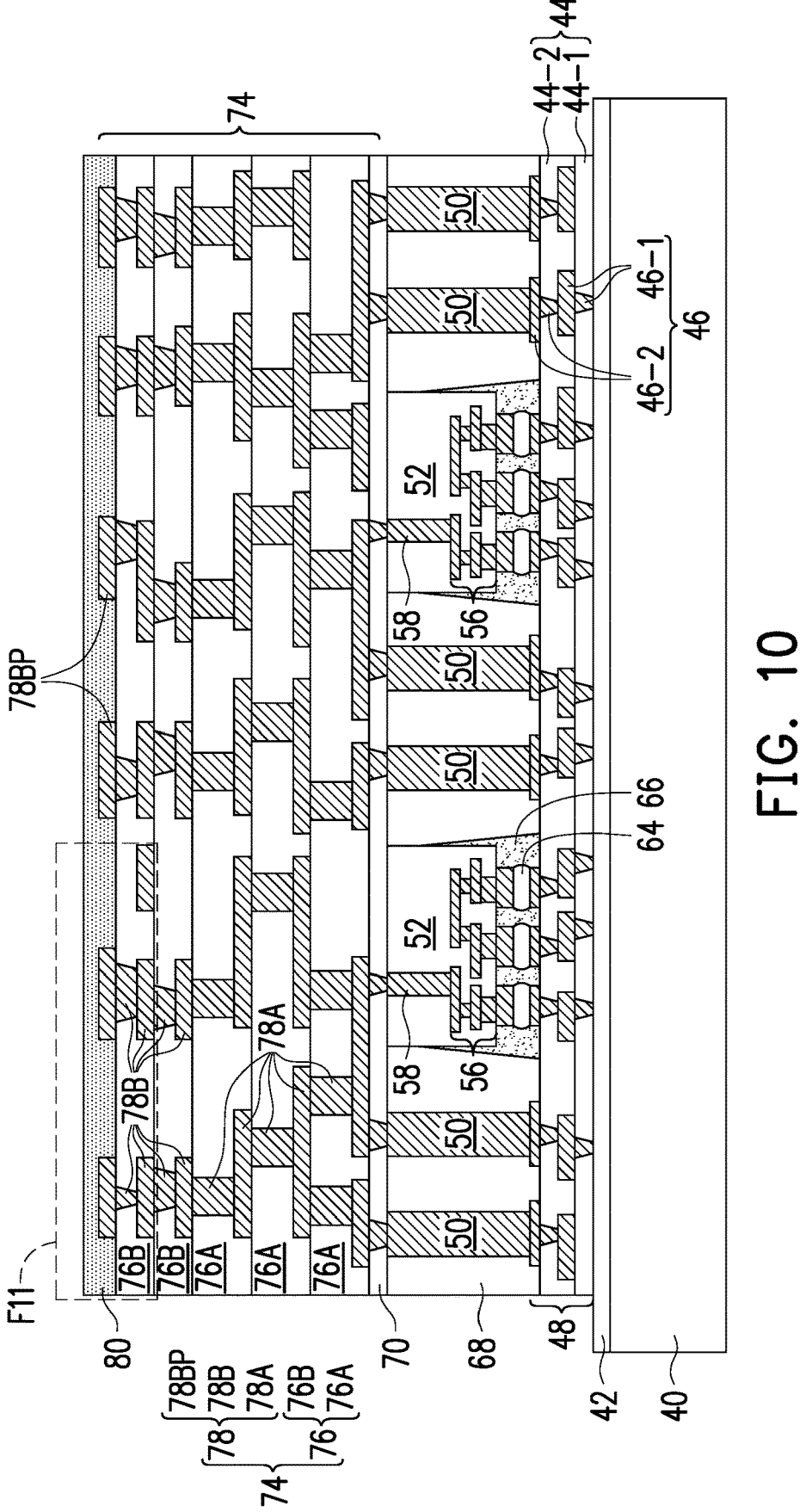
Figures 11, 12:
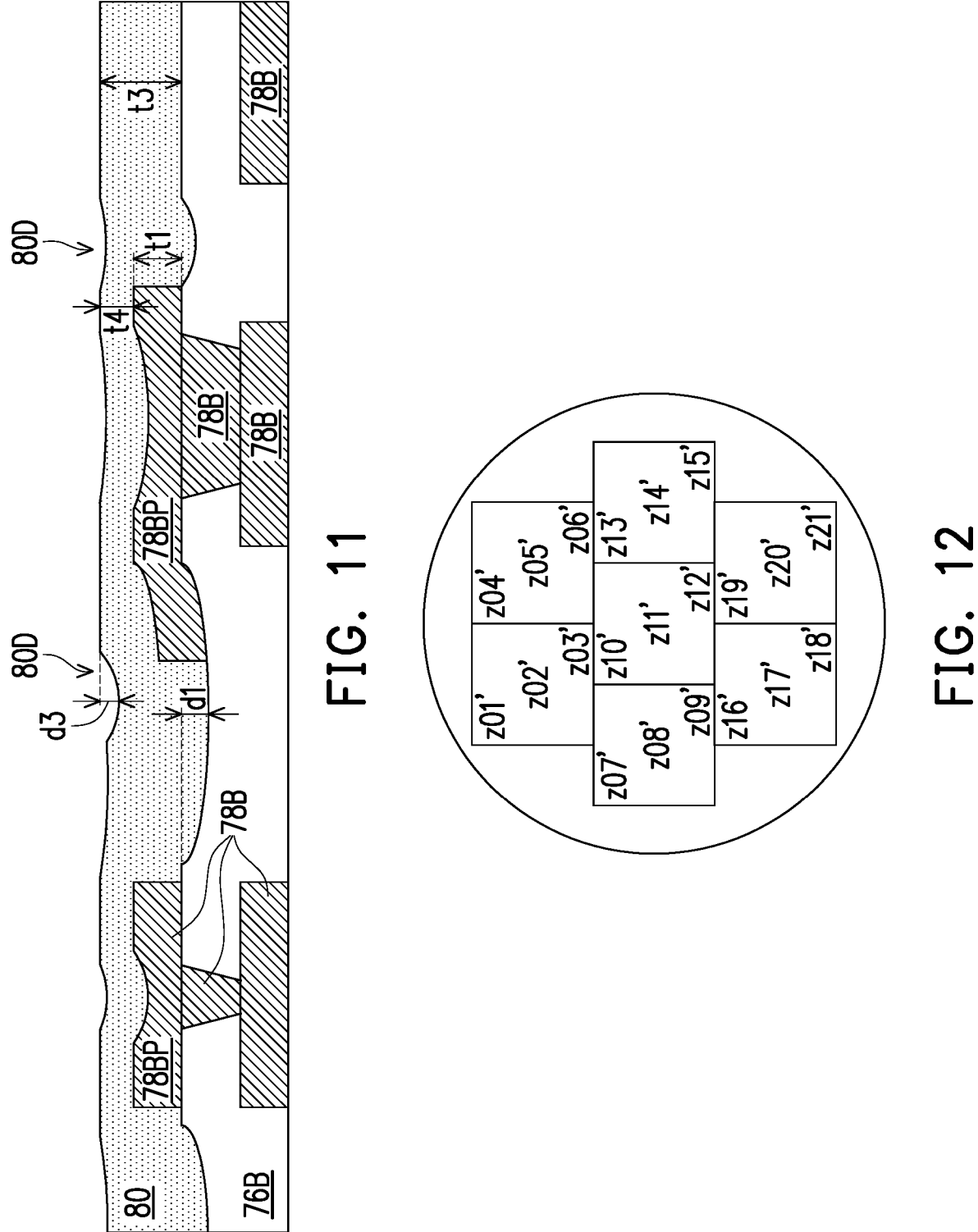

As illustrated in FIGS. 10, 11, and 12, embodiments address this issue by depositing a buffer layer 80 over the conductive features 78BP. The respective process is illustrated as process 212 in the process flow 200 as shown in FIG. 23. The buffer layer 80 reduces the topography differences in the uppermost surface of the redistribution structure 74 by covering over the upper dielectric layer 76B and conductive elements 78BP. Then, when a FoW layer is used to perform the carrier-switch process, less layer can be used and the remaining FoW layer may be removed more easily without damaging the upper dielectric layer 76B beyond an acceptable amount.

In FIG. 10 the buffer layer 80 is formed over the structure of FIG. 8, to cover over the conductive features 78BP and the upper dielectric layer 76B. The buffer layer 80 may be formed of the same candidate materials as the upper dielectric layer 76B and may be formed using similar processes. When the material of the buffer layer 80 is the same as the material of the upper dielectric layer 76B, then the interface between the buffer layer 80 and the upper dielectric layer 76B may not be distinguishable.

FIG. 11 illustrates an enlarged view of the dashed box of FIG. 10 labeled F11. FIG. 11 is also a view of the structure illustrated in FIG. 8 after the buffer layer 80 has been deposited. As illustrated in FIG. 11, the depressions 76D and 78D are filled with the buffer layer 80. The buffer layer 80 extends over an upper surface of the conductive features 78BP. The depressions 76D and 78D (see FIG. 8) and projections of the conductive features 78BP transfer to some extent to the upper surface of the buffer layer 80, however, the correspondence is muted because the buffer layer 80 has lower conformity. As such, the depressions 80D in the upper surface of the buffer layer 80 are about 5-20% of their corresponding depressions 76D and 78D. The distance d3 of the depression 80D, for example, may on average be about 2-5 μm with a maximum depth of about 8-10 μm.

The thickness t3 of the buffer layer 80 is greater than the thickness t1 of the conductive features 78BP. In some embodiments, the thickness t3 may be between 130% to 250% of the thickness t1 of the conductive features 78BP. A portion of the buffer layer 80 over the conductive features 78BP may be relatively thinner than the portion of the buffer layer 80 over the dielectric layer 76B. In some embodiments, the thickness t4 of the portion of the buffer layer 80 over the conductive features 78BP may be between 30% and 150% of the thickness of the conductive features 78BP. For example, when the thickness t1 is between about 12 μm and 14 μm, the thickness t3 may be between about 18 μm and about 25 μm, such as about 20 μm, and the thickness t4 may be between about 3 μm and about 10 μm, though other values may be used.

In FIG. 12, as a result of including the buffer layer 80, the topography of the workpiece (e.g., carrier 40 with distinct package areas formed thereon) is reduced. In some embodiments the average topography may be reduced to be between 10% and 25% of the previous average topography, and the maximum topography may be reduced to be between about 10% and 35% of the previous maximum topography. For example, the sample values for z01, z02, z03, z04, z05, z06, z07, z08, z09, z10, z11, z12, z13, z14, z15, z16, z17, z18, z19, z20, and z21 have been altered to the sample values for z01', z02', z03', z04', z05', z06', z07', z08', z09', z10', z11', z12', z13', z14', z15', z16', z17', z18', z19', z20', and z21', which may be measured as (in μm) 1.4, 5.5, 4.6, 8.4, 1.8, 0.9, 3.6, 3.1, 0.7, 2.1, 1.6, 2.5, 2.6, 7.6, 0.2, 0.2, 1.3, 1.0, 1.5, 5.5, and 7.7, respectively, for an average topography of 3.0 and maximum topography of 8.4. The reduced topography means that the thickness of the FoW layer may be reduced and the remaining FoW layer is more easily removed.

Figure 13:
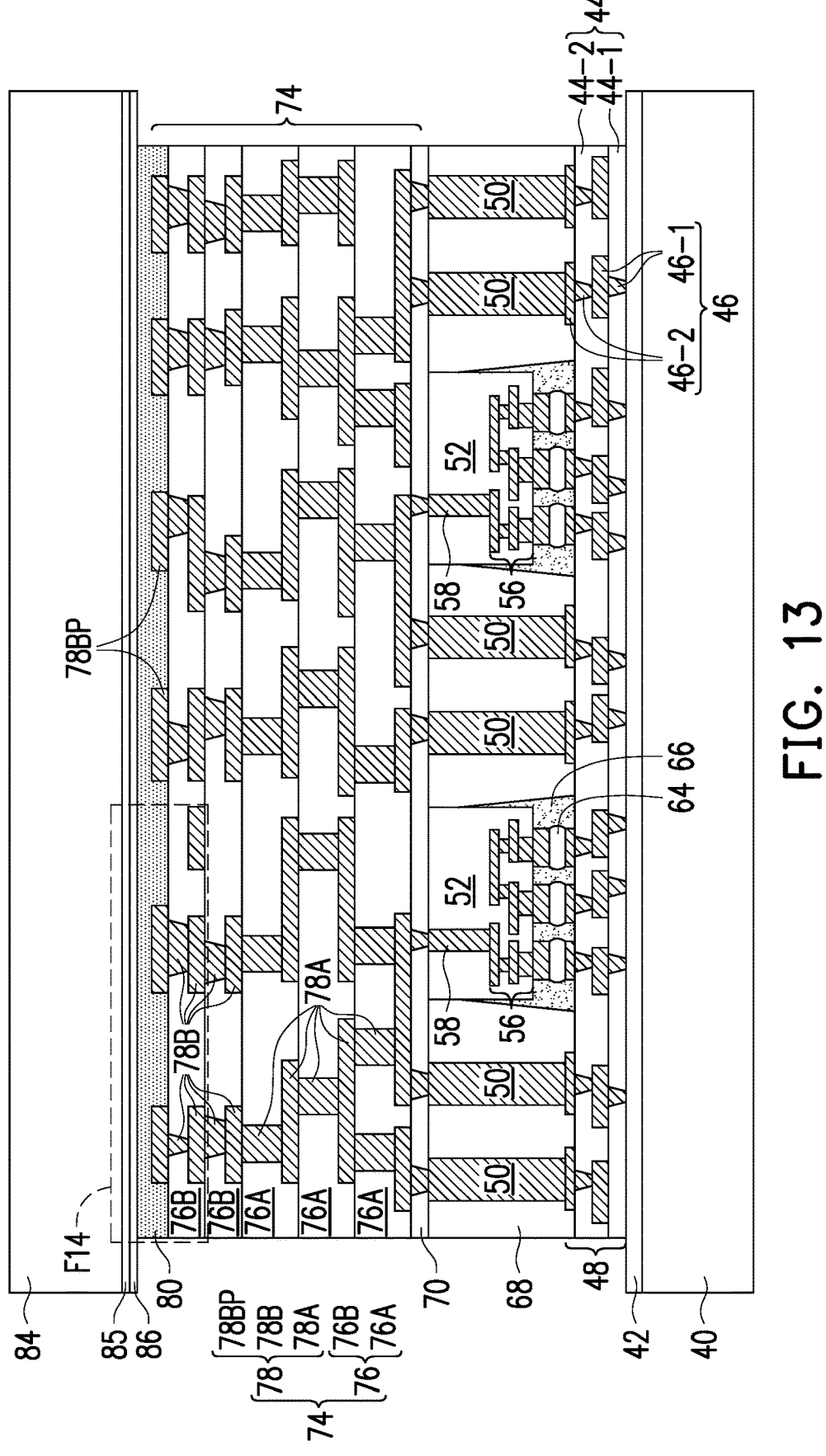

In FIG. 13, a carrier-switch process is performed. The respective process is illustrated as process 214 in the process flow 200 as shown in FIG. 23. In the carrier-switch process, the buffer layer 80 over the redistribution structure 74 is first attached to carrier 84 through the FoW layer 86. Carrier 84 may be formed of a transparent material, and may be a glass carrier, a ceramic carrier, or the like. FoW layer 86 may be formed on the carrier 84 on a release film 85. The FoW layer 86 may be formed of a base material, which may include a polymer, a resin, an epoxy, and/or the like, and filler particles in the base material. The filler particles may be dielectric particles of silica, alumina, boron nitride, or the like. The release film 85 may be similar to the release film 42. In some embodiments, the FoW layer 86 may be a LTHC coating material and may also serve as the release film 85. Carrier 40 is then de-bonded from redistribution structure 48. In the de-bonding process, a light beam (which may be a laser beam) is projected on release film 42, and the light beam penetrates through the transparent carrier 40. Release film 42 is thus decomposed. Carrier 40 may be lifted off from release film 42, and hence redistribution structure 74 is de-bonded (demounted) from carrier 40.

Figure 14:
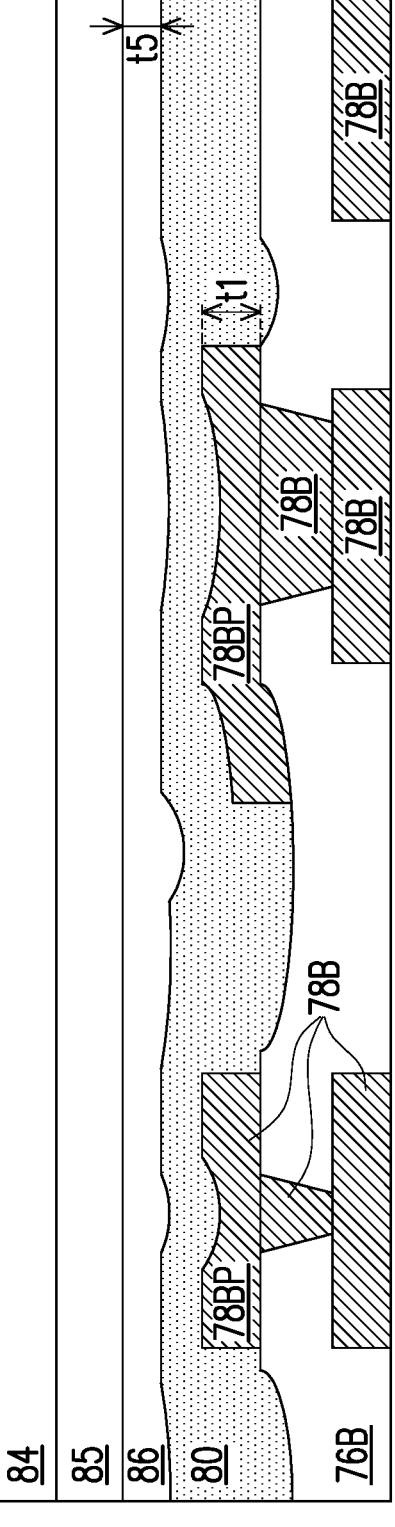

FIG. 14 illustrates an enlarged view of the dashed box of FIG. 13 labeled F14. FIG. 14 is also a view of the structure illustrated in FIG. 11 after the carrier 84 is attached to the buffer layer 80 by the FoW layer 86. Because the buffer material reduces the topography of the conductive features 78BP and dielectric layer 76B, the thickness t5 of the FoW layer 86 may be much less than would otherwise be necessary to attach the carrier 84 to the conductive features 78BP. For example, in some embodiments, the thickness t5 may be reduced by about 40-80%. Whereas the thickness necessary was about 40 μm, embodiments may use a thickness t5 of the FoW layer 86 of between 10 μm and 25 μm. In some embodiments, the thickness of the FoW layer 86 is about 8-14 μm thicker than the maximum topography. In some embodiments, the thickness t5 of the FoW layer is about 2 to 4 times thicker than the average topography of the buffer layer 80. The thickness t5 of the FoW layer is preferably as small as necessary so that it can be more easily removed, yet also fill in the topography of the buffer layer 80. Such thicknesses and/or ratios can thus be used to provide a good balance for the thickness t5 of the FoW layer.

Figure 15:
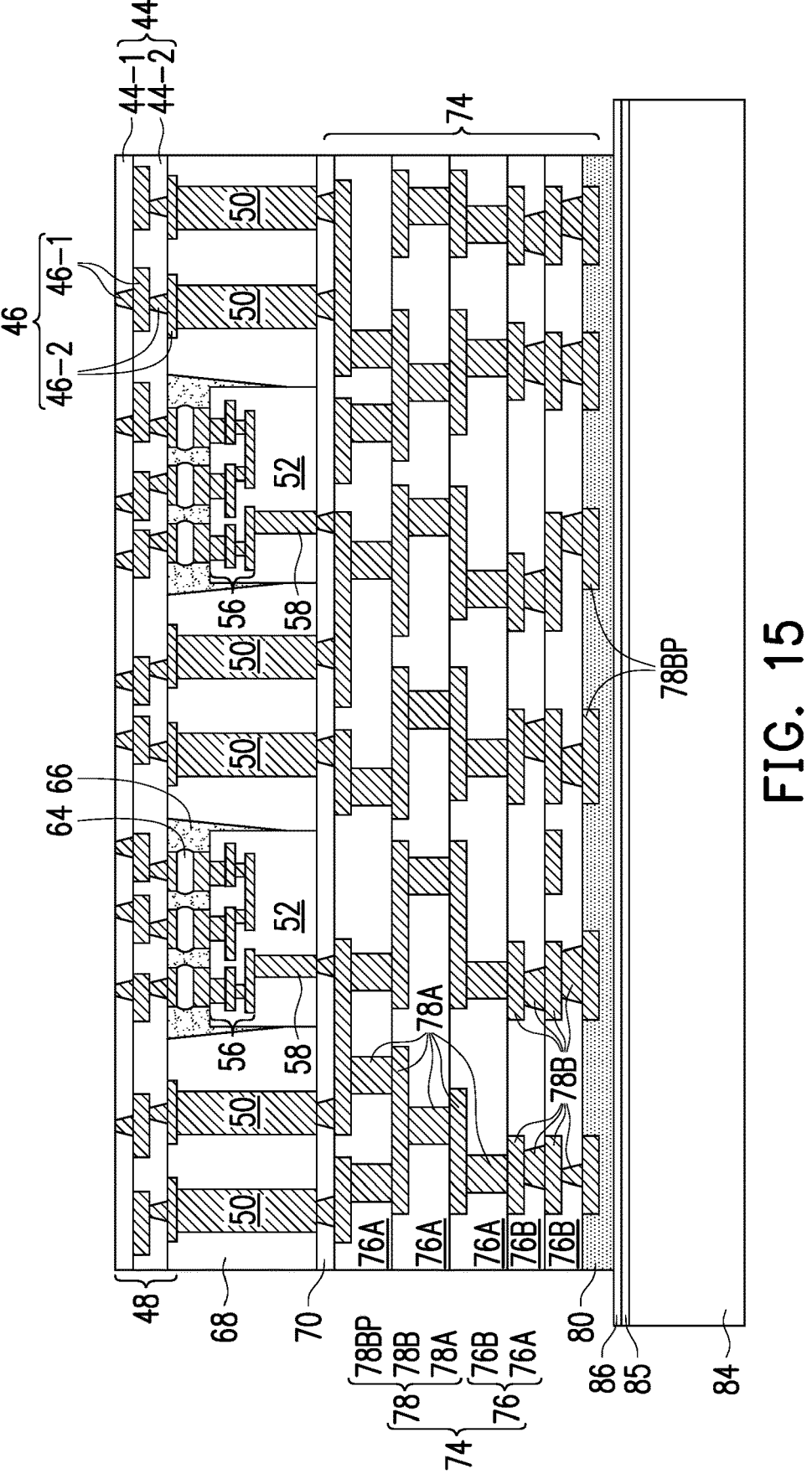
Figure 15:
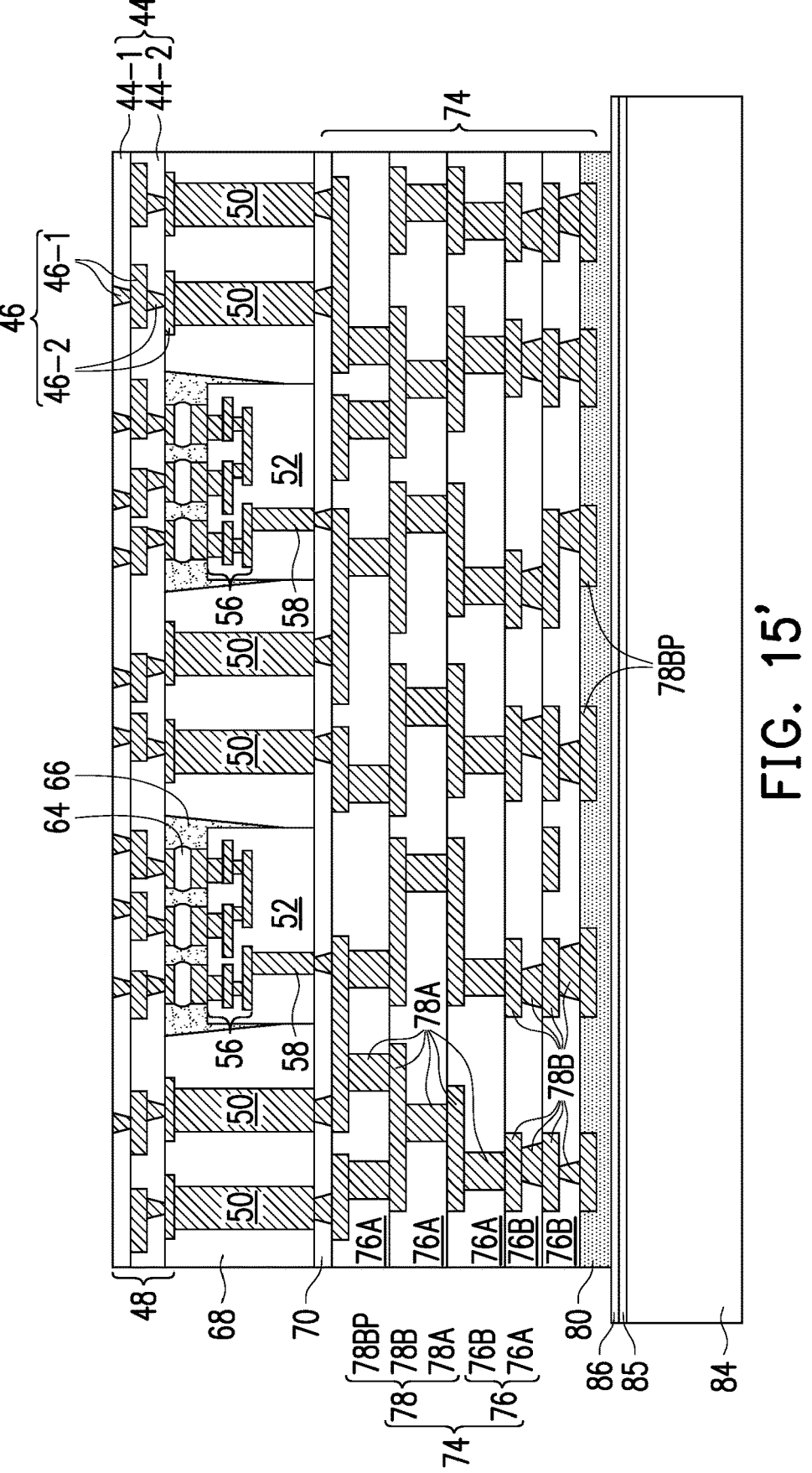
Figure 15:
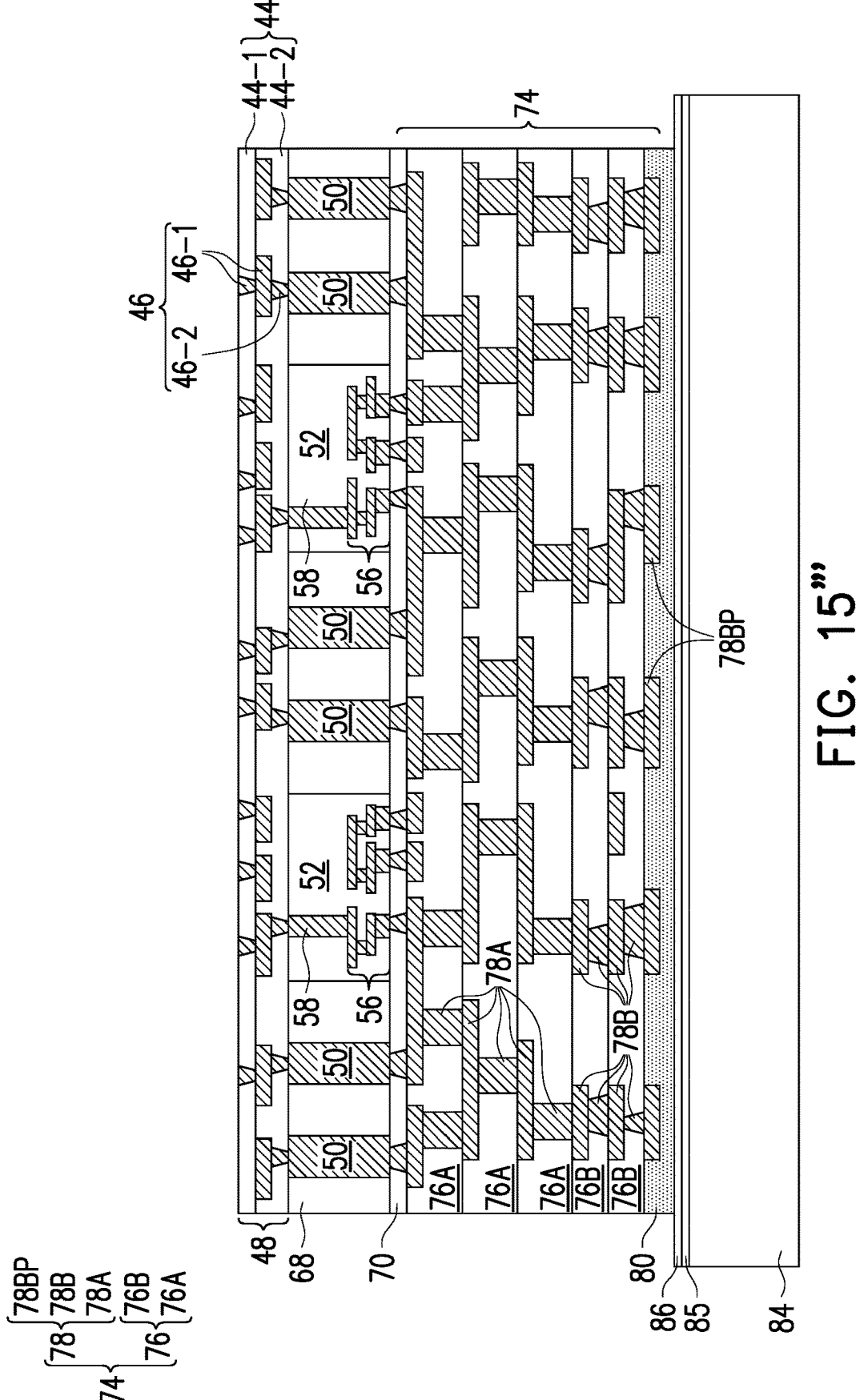

FIG. 15 illustrates the structure of FIG. 13, with the carrier 40 removed and the structure flipped over so that the RDLs 46 are facing upward in preparation for the formation of conductive connectors thereupon. FIGS. 15', 15", and 15''' illustrate variations on the structure of FIG. 15, which may be achieved by forming various elements in a different order or using different techniques. For example, in FIG. 15' the redistribution structure 48 is formed in whole or in part after the carrier switch process described with respect to FIG. 14. In such embodiments, the RDLs 46-2 may, in part, be formed on the release film 42. Then, the rest of the structure is formed. After the carrier switch process, the redistribution structure 48 may be formed. Similarly, the redistribution structure of FIG. 15 may be extended to form additional RDLs 46 and dielectric layers 44 thereover. As illustrated in FIG. 15', one result of forming the redistribution structure 48 (in whole or in part) after the carrier switch, is that the via portions of the RDLs 46 are tapered opposite the via portions of the redistribution structure 74 (e.g., RDLs 78B).

FIG. 15" is similar to FIG. 15' in that the redistribution structure 48 is formed after the carrier switch, except that in FIG. 15", none of the redistribution structure 48 is formed. Thus, the through-vias 50 and integrated circuit dies 52 are attached or formed on the release layer 42, which are then exposed, when the carrier switch is performed. Then the redistribution structure 48 is formed, such as illustrated in FIG. 15" and described above. FIG. 15''' is similar to FIG. 15" except that the integrated circuit dies 52 are attached face up to the release layer 42. Then, the redistribution structure 48 is formed after the carrier switch. In such embodiments, the through-vias 58 may be buried and may be exposed by a planarization, such as a CMP process prior to forming the redistribution structure 48.

Figure 16:
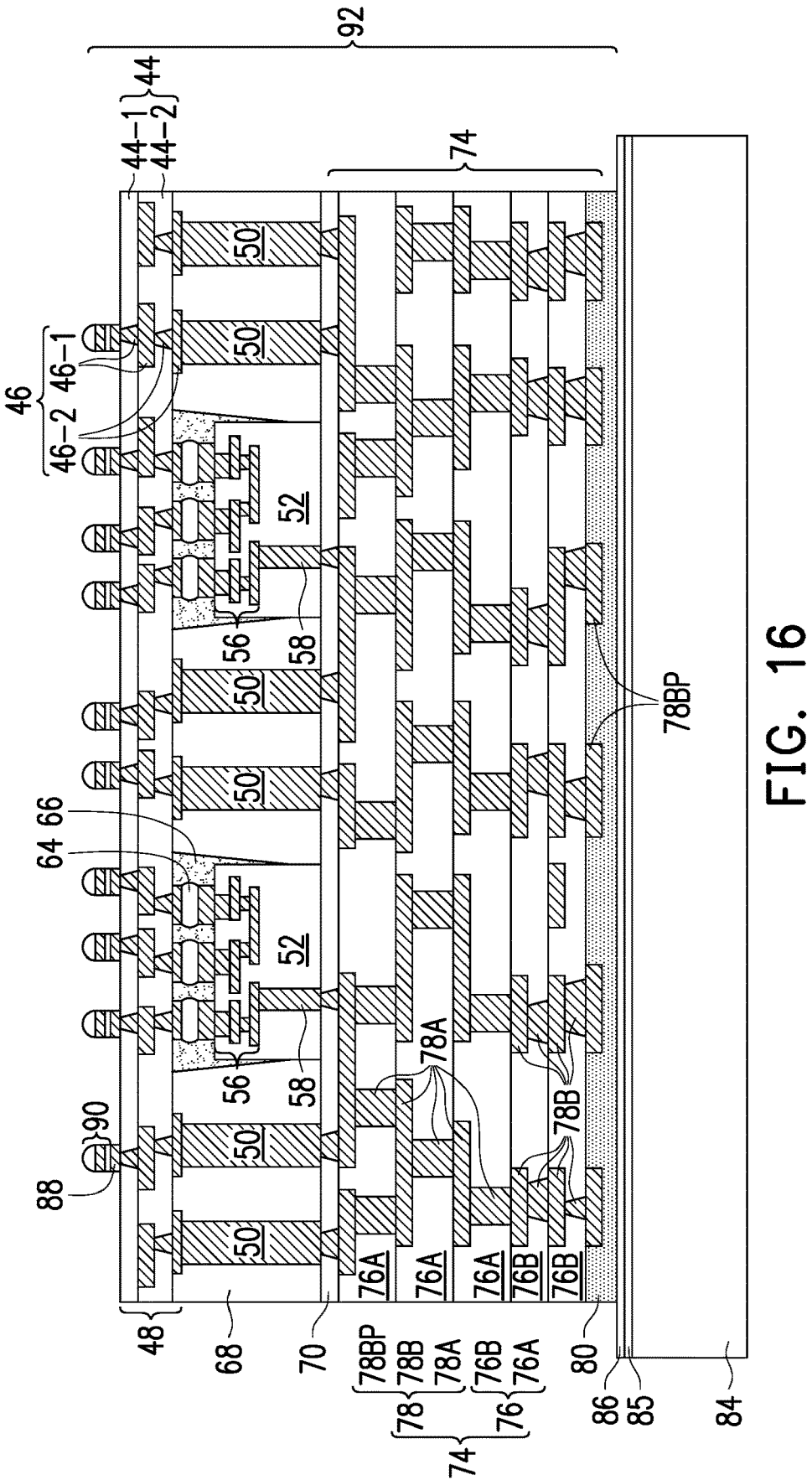

FIG. 16 illustrates the formation of UBMs 88 and electrical connectors 90 in accordance with some embodiments. The respective process is illustrated as process 216 in the process flow 200 as shown in FIG. 23. UBMs 88 may be formed of or comprise nickel, copper, titanium, or multilayers thereof. Electrical connectors 90 are then formed on UBMs 88. The formation of electrical connectors 90 may include placing solder balls on the exposed portions of UBMs 88, and then reflowing the solder balls, and hence electrical connectors 90 are solder regions. In accordance with alternative embodiments of the present disclosure, the formation of electrical connectors 90 includes performing a plating process to form solder layers, and then reflowing the solder layers. Electrical connectors 90 may also include non-solder metal pillars, or may have composite structures including metal pillars and solder caps over the non-solder metal pillars, which may also be formed through plating.

Forming the electrical connectors 90 creates the package component 92. In some embodiments, the package component 92 may be a fan out package including active devices in the discrete dies 52. In other embodiments, the discrete dies 52 may be local silicon interconnects and the package component 92 is an interposer.

Figure 17:
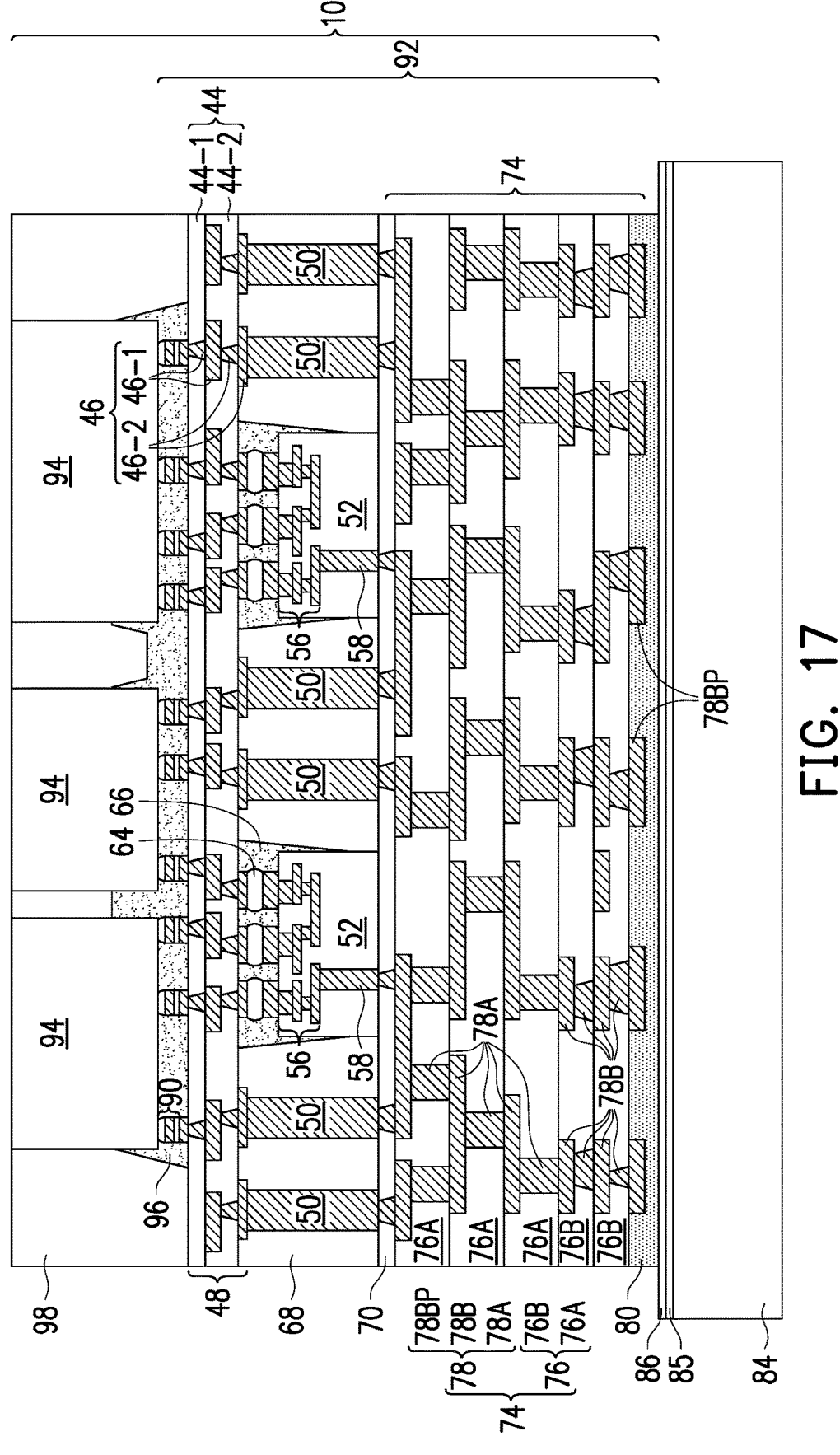

Referring to FIG. 17, a plurality of package components 94 are bonded to electrical connectors 90. The respective process is illustrated as process 218 in the process flow 200 as shown in FIG. 23. Package 100 is thus formed. In accordance with some embodiments, package components 94 include a logic die, which may be a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. Package components 94 may also include a memory die(s) such as Dynamic Random-Access Memory (DRAM) dies, Static Random-Access Memory (SRAM) dies, or the like. The memory dies may be discrete memory dies, or may be in the form of a die stack that includes a plurality of stacked memory dies. Package components 94 may also include System-on-Chip (SOC) dies.

Next, underfill 96 is dispensed into the gap between package components 94 and the redistribution structure 48. Package components 94 are then encapsulated in encapsulant 98, which may include a molding compound, a molding underfill, or the like.

Figure 18:
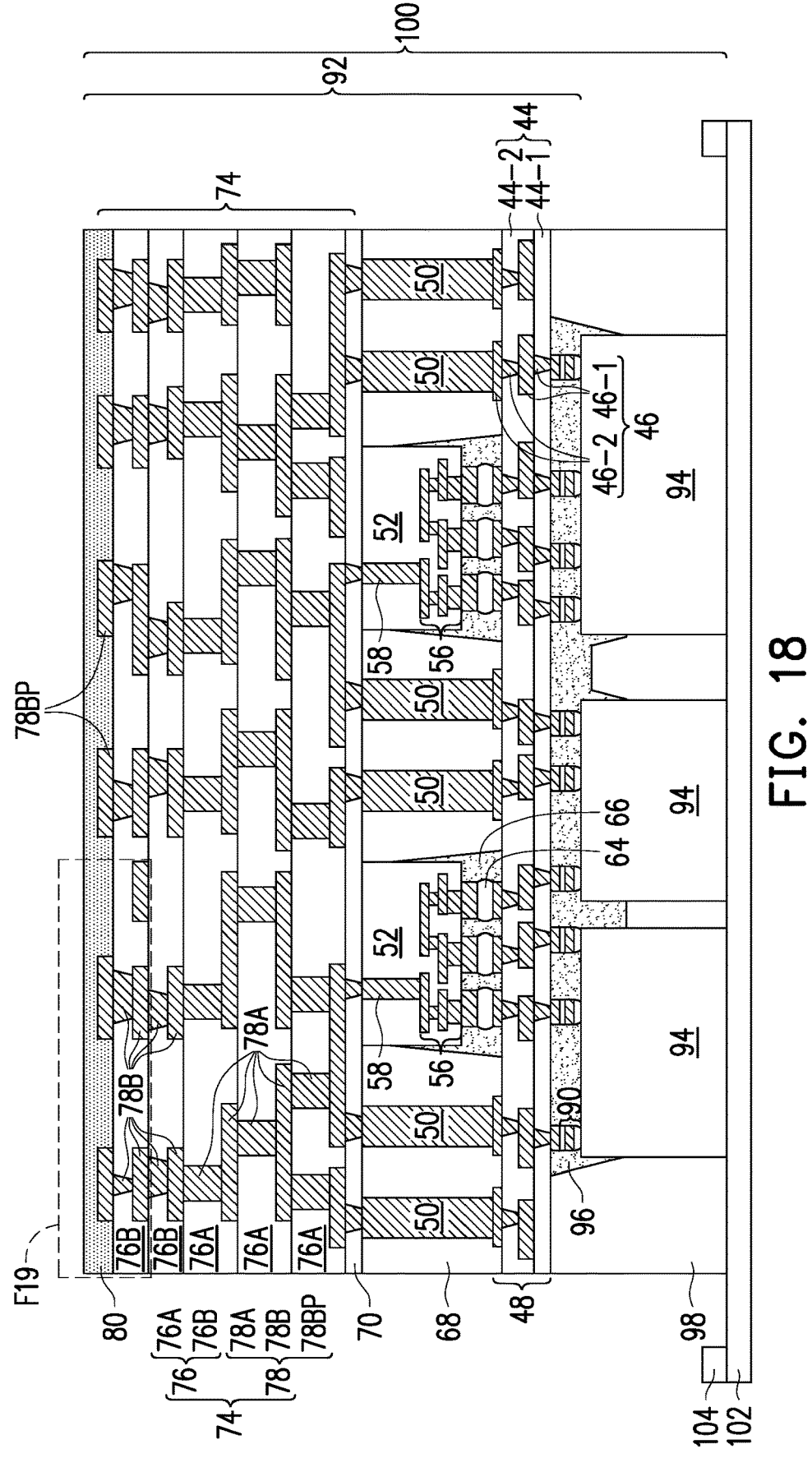

Next, package 100 is de-bonded (demounted) from carrier 84. The respective process is illustrated as process 220 in the process flow 200 as shown in FIG. 23. The de-bonding may be performed, for example, by projecting a light beam (which may be a laser beam) on release film 85, and the light beam penetrates through the transparent carrier 84. Release film 85 is thus decomposed. Carrier 84 is lifted off from release film 85 and hence package 100 is de-bonded (demounted) from carrier 84. The resulting packages 100 are shown in FIG. 18. Package 100 is then placed on tape 102, which may be fixed on a frame 104.

Following the removal of the carrier 84, the FoW layer 86 may remain, at least in part over the buffer layer 80 and the conductive features 78BP are buried in the buffer layer 80. FIGS. 19A, 19B, 19C, 19D, 19E, and 19F illustrate a progressive process to remove the FoW layer 86 and reduce the thickness of the buffer layer 80 so that the conductive features 78BP are revealed. The respective process is illustrated as process 222 in the process flow 200 as shown in FIG. 23. The view of FIGS. 19A-19F are enlarged views of the dashed box F19 of FIG. 18.

Figures 19A, 19B, 19C:
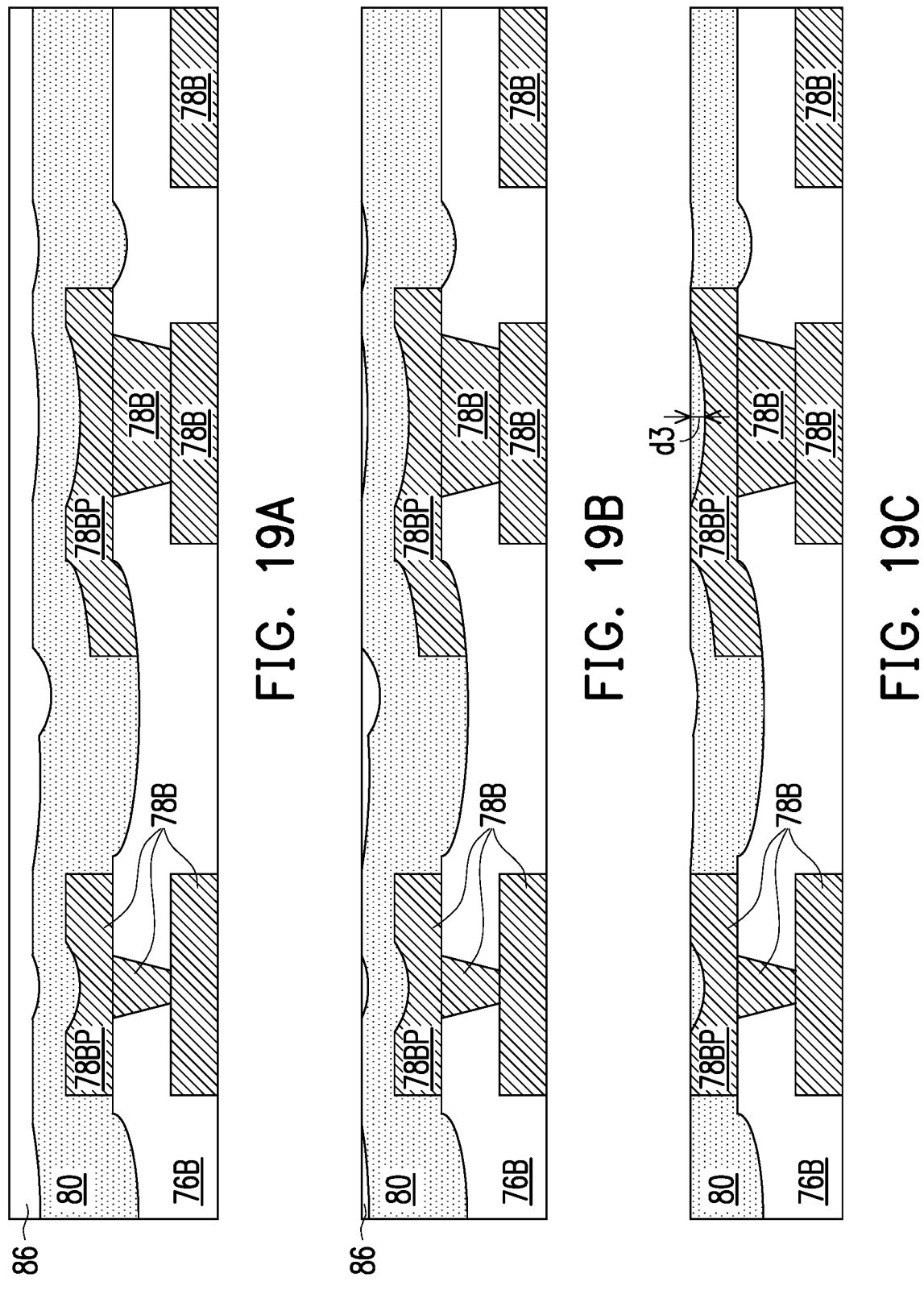

FIG. 19A illustrates the enlarged view of the structure of FIG. 18 after the debonding of the carrier 84. As illustrated in FIG. 19A, the FoW layer 86 may remain over the buffer layer 80.

In FIG. 19B, an etching process may be used to remove the FoW layer 86 so that portions of the buffer layer 80 are revealed. Some remnants of the FoW layer 86 may remain within depressions in the upper surface of the buffer layer 80. The FoW layer 86 may be removed using a dry etch or wet etch with a suitable etchant for the material of the FoW layer 86. In some embodiments a plasma etch is used to react radicals of an etchant gas with the material of the FoW layer 86, thereby removing the FoW layer 86 by the plasma gas. In some embodiments, all of the FoW layer 86 may be removed, while in other embodiments some of the FoW layer 86 may remain behind in the depressions 80D, for example (see FIG. 11).

In FIG. 19C, the etching process may continue, switching etchant gasses as appropriate, to remove a portion of the buffer layer 80 and expose the conductive features 78BP. In the process of removing the upper portions of the buffer layer 80, the remaining FoW layer 86 (if any) may be removed. As illustrated in FIG. 19C, some of the buffer layer 80 may remain in the depressions 78D (see FIG. 8) in the upper surface of the conductive features 78BP. Thus, the thickness of the buffer layer 80 over the conductive features 78BP corresponds to the distance d2.

Figures 19D, 19E, 19F:
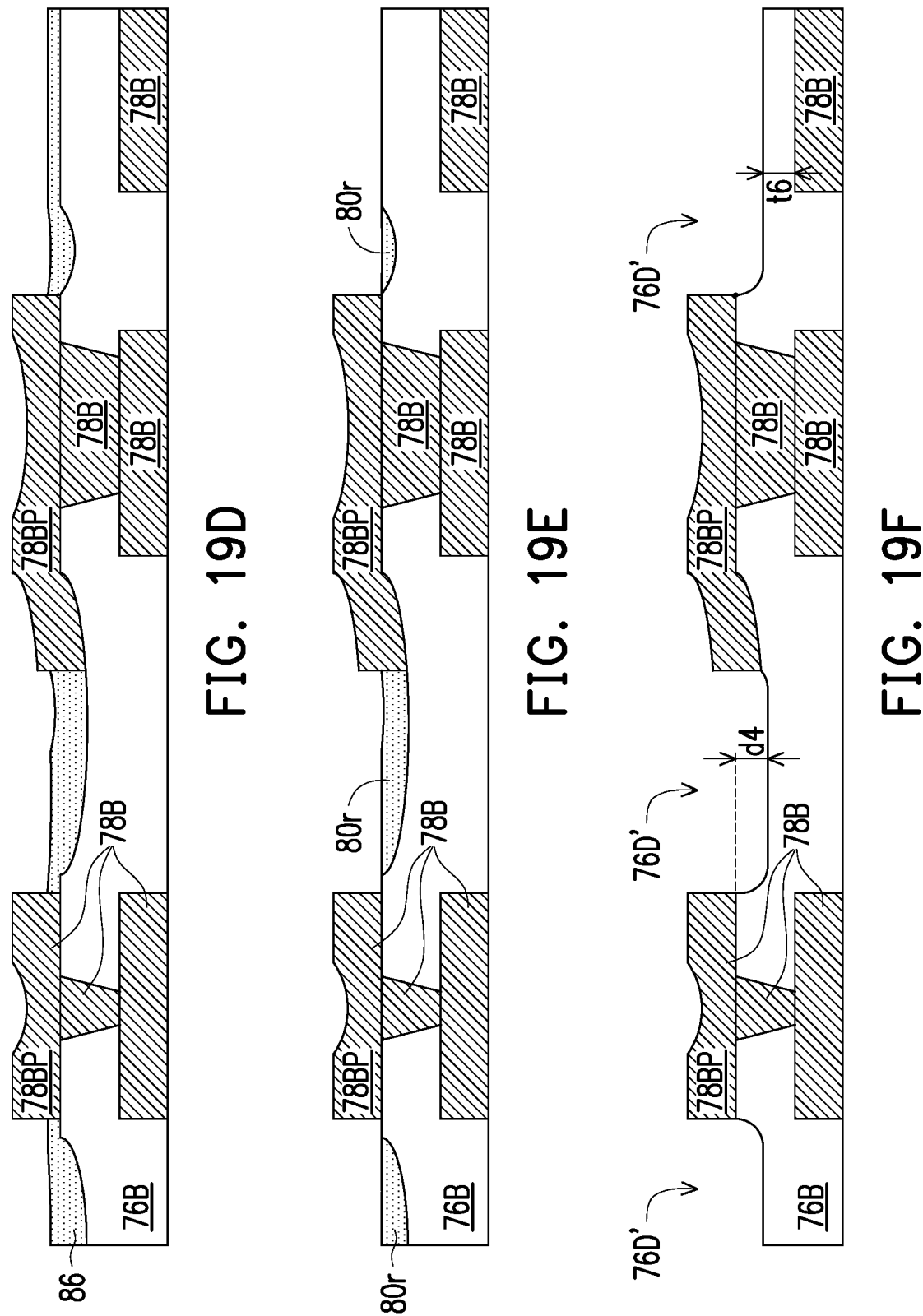

In FIG. 19D, the etching process may continue in order to remove the portion of the buffer layer 80 in the depression of the conductive features 78BP. As illustrated in FIG. 19D, this further etches the portion of the buffer layer 80 surrounding the conductive features 78BP, causing the conductive features 78BP to become partially laterally surrounded by the buffer layer 80, but also protrude from the buffer layer 80. In other words, a base portion of the conductive features 78BP is laterally surrounded by the buffer layer 80, while the surface of the conductive features 78BP are still exposed from the buffer layer 80. The upper surface of the dielectric layer 76B is still completely covered by the buffer layer 80. Notably, without the buffer layer 80, because of the large average topography, removing the FoW layer 86, which would be contacting the dielectric layer 76B, would cause etching of the dielectric layer 76B and possibly exposing the RDLs 78B. The etching process may stop after the etching in FIG. 19D, in which case the buffer layer 80 would remain in the final structure. If the buffer layer 80 is made of the same material composition as the dielectric layer 76B, then the conductive features 78BP will appear to be partially embedded in an upper surface of the redistribution structure 74.

In FIG. 19E, in some embodiments, the etching process may continue in order to remove more of the buffer layer 80 and expose the upper surface of the dielectric layer 76B. Remnant portions 80r of the buffer layer 80 may remain in depressions, such as depressions 76D (see FIG. 8). In some cases, such as illustrated in FIG. 19E, the remnant portions 80r may contact sidewalls of the conductive features 78BP, while other sidewalls of the conductive features 78BP are freed from the buffer layer 80 and remnant portions 80r. The etching process may be stopped after the etching in FIG. 19E, in which case the remnant portions 80r would remain in the final structure.

In FIG. 19F, in some embodiments, the etching process may continue in order to remove the rest of the buffer layer 80 (i.e., including the remnant portions 80r of FIG. 19E). In such embodiments, the depressions 76D are extended further into the dielectric layer 76B to form the depressions 76D'. The depressions 76D' may have a depth corresponding to the distance d4. In some embodiments, the distance d4 may be up to about 40% larger than the distance d1 (i.e., the depth of the depression 76D in FIG. 8). The distance d4 may be between about 5 and 9 μm, such as about 7 μm. The thickness t6 of the dielectric layer 76B may be between about 6 μm and 13 μm, such as about 9 μm. Because the buffer layer 80 is used to reduce the topography, then the upper surface of the dielectric layer 76B is much smoother (whether the etching is stopped after FIG. 19E (and includes the remnants 80r) or after FIG. 19F). In addition, the thickness t6 is maintained so that the RDLs 78B remain protected by the dielectric layer 76B.

Figure 20:
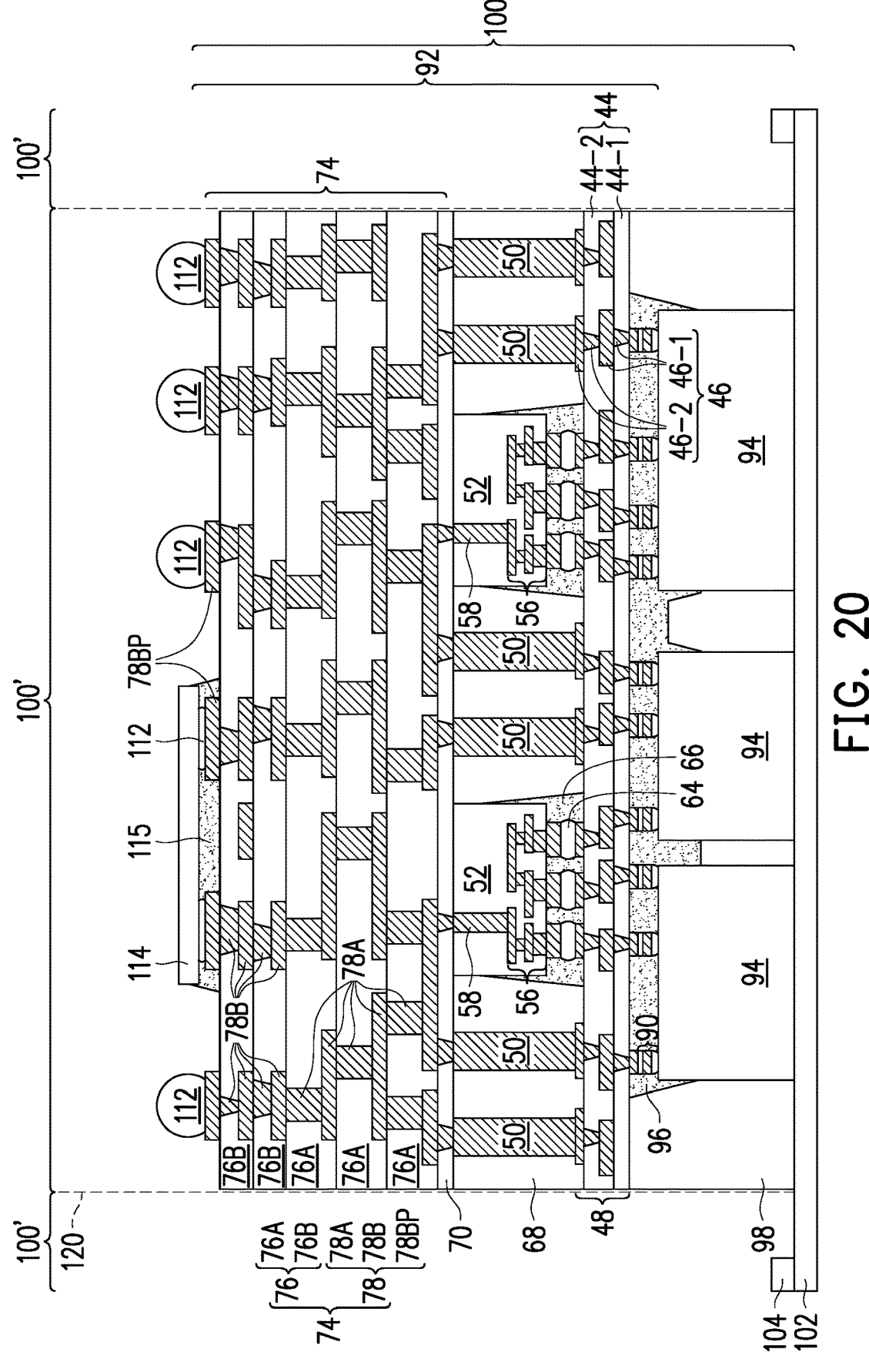

In FIG. 20, conductive connectors 112 are formed on the conductive features 78BP, which may serve as under-bump metallurgies (UBMs). The respective process is illustrated as process 224 in the process flow 200 as shown in FIG. 23. The conductive connectors 112 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 112 may include a conductive material such as solder, copper, aluminum, gold, nickel, silver, palladium, tin, the like, or a combination thereof. In some embodiments, the conductive connectors 112 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 112 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, some of the conductive connectors 112 may be used to mount an integrated passive device (IPD) 114 to the conductive connectors 112, for example, by a pick and place process. IPDs 114 may be interspersed among the conductive connectors 112. The IPDs 114 may be a capacitor die, an inductor die, a resistor die, or the like. Underfill 115 may be dispensed between package IPDs 114 and the redistribution structure 74.

FIG. 20 also illustrates, a singulation process 120 may be used to separate the packages 100' from one another. The respective process is illustrated as process 226 in the process flow 200 as shown in FIG. 23. The singulation process 120 may include a mechanical process such as a sawing process, a cutting process, or the like. In some embodiments, the singulation process 120 may include an etching process, lasering process, mechanical process, and/or combinations thereof. The singulation process 120 is performed along the scribe line regions between packages 100'.

Figure 21:
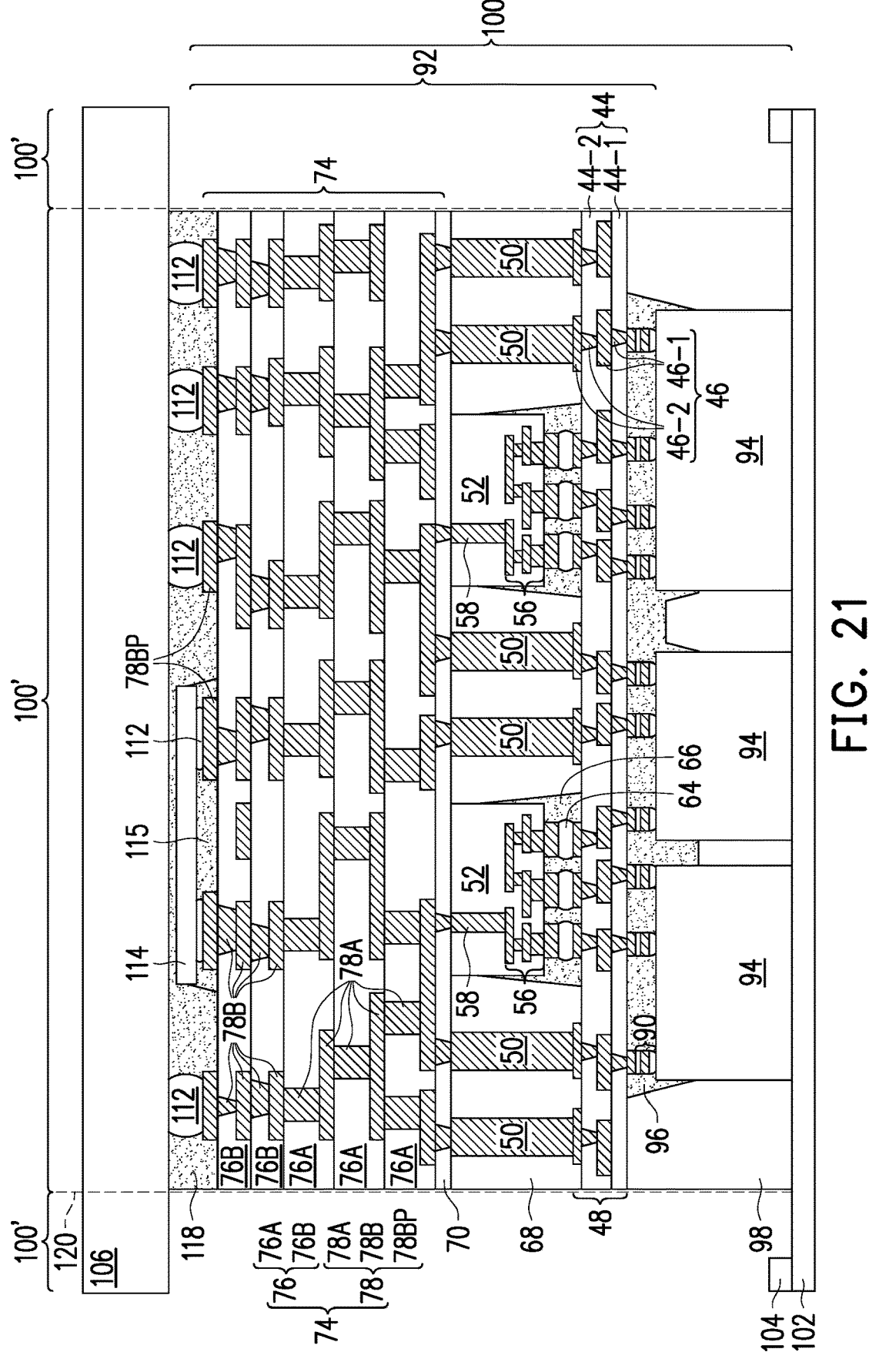

FIG. 21 illustrates the bonding of package substrate 106 to package 100. The respective process is illustrated as process 228 in the process flow 200 as shown in FIG. 30. Package substrate 106 may include organic dielectric layers, and are sometimes referred to as organic package substrates. Package substrate 106 may also be cored package substrates including cores, or may be core-less package substrates that do not have cores therein. For example, package substrate 106 may include a dielectric core, and Plating Through-Holes (PTHs, which are conductive pipes) therein. The package substrate 106 may be referred to as a prepared substrate.

In FIG. 21, in accordance with some embodiments, package substrate 106 is in an un-sawed wafer, and is bonded to package 100 through wafer-to-wafer bonding or die-to-wafer bonding (with packages 100' being in the die form). Then a singulation process may be used to separate the packages 100' including the package substrate 106 from one another. In some embodiments, the packages 100' are already separated prior to bonding to the package substrate 106. In such embodiments, a singulation process may be used to separate a portion of the package substrate 106 to be used in conjunction with the packages 100'. An underfill 118 may be dispensed between package 100' and package substrate 106.

Figure 22:
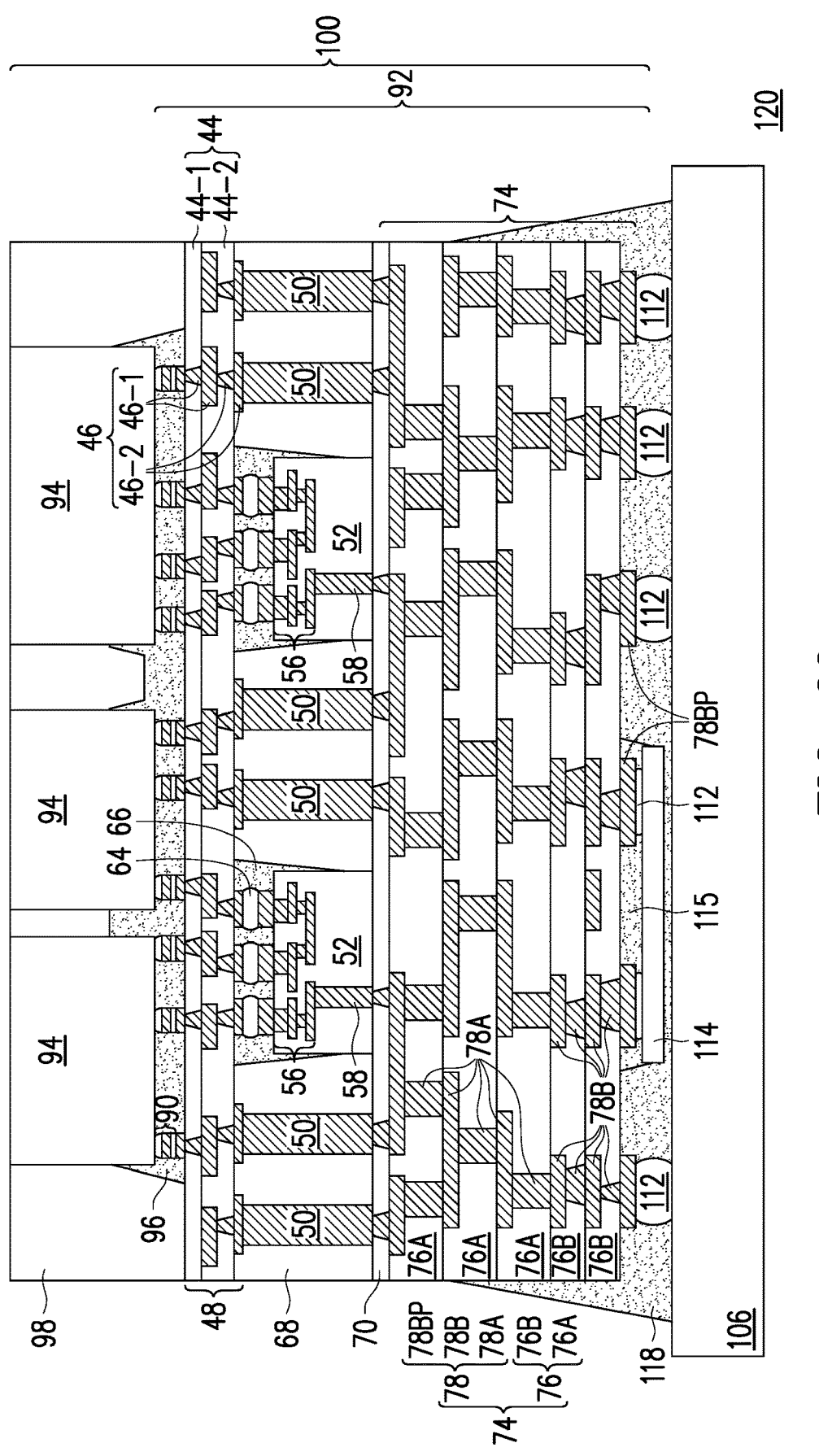

In FIG. 22, in accordance with some embodiments, package substrate 106 is a discrete substrate, and is bonded to package 100 through die-to-die bonding. The bonding may be achieved through conductive connectors 112. An underfill 118 may be dispensed between package 100 and package substrate 106.

In above-illustrated embodiments, some processes and features are discussed in accordance with some embodiments to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. Utilizing a buffer layer over conductive connectors provides the ability to perform a carrier switch process while reducing the risk of damage to the conductive and non-conductive layers which would ordinarily occur. In addition, the thickness of the film-on-wire material for attaching to the second carrier during the carrier switch may be applied more thinly, resulting in faster processing times. Accordingly, device yield can be improved at a reduced cost.

One embodiment is a method including forming a first package component, by: forming a first interconnect over a first carrier; forming electrical connectors over the first interconnect; depositing a buffer layer over the electrical connectors, the buffer layer burying the electrical connectors; attaching a second carrier to the buffer layer; and removing the first carrier. The method also includes attaching a chip to a side of the first interconnect opposite the buffer layer. The method also includes laterally encapsulating the chip in an encapsulant. The method also includes debonding the second carrier. The method also includes removing at least a portion of the buffer layer to expose the electrical connectors. The method also includes singulating a first package device from the first package component, the first package component including the chip.

In an embodiment, the encapsulant is a second encapsulant, and the method may include: prior to forming the first interconnect, attaching a discrete die over the first carrier; and encapsulating the discrete die in a first encapsulant. In an embodiment, the discrete die is a local silicon interconnect die. In an embodiment, the method may include: disposing a film on wire (FoW) layer between the buffer layer and the second carrier; and following debonding the second carrier, removing the FoW layer from the buffer layer. In an embodiment, a thickness of the FoW layer is between 2 and 3 times a maximum topography of an upper surface of the buffer layer. In an embodiment, the method may include: following removing at least a portion of the buffer layer, a portion of the buffer layer remains in a depression in an upper surface of the electrical connectors; and etching the portion of the buffer layer in the depression of the upper surface of the electrical connectors, the etching recessing an upper surface of the first interconnect. In an embodiment, prior to depositing the buffer layer, an average upper surface topography is between about 20 and 30 μm, where after depositing the buffer layer, the average upper surface topography is between 3 and 7 μm. In an embodiment, the buffer layer may include a first material, and an upper dielectric layer of the first interconnect may include a second material, the second material different from the first material. In an embodiment, following attaching the prepared substrate, a remnant of the first material is interposed between the prepared substrate and the first interconnect.

Another embodiment is a method including attaching a first die to a first carrier and forming a metal pillar on the first carrier. The method also includes encapsulating the first die and metal pillar in a first encapsulant. The method also includes forming a first redistribution structure over the first encapsulant. The method also includes forming first connectors over the first redistribution structure, where following

14 ing forming the first connectors, an upper surface of the first redistribution structure together with the first connectors has a first average topography. The method also includes forming a buffer layer over the first redistribution structure and the first connectors, an upper surface of the buffer layer having a second average topography, the second average topography being less than half of the first average topography. The method also includes performing a carrier switch process to a second carrier. The method also includes attaching a second die on a side of the first encapsulant opposite the first redistribution structure.

In an embodiment, the method may include disposing an epoxy film between the second carrier and the buffer layer. In an embodiment, the method may include removing the second carrier and etching the epoxy film to remove the epoxy film from over the buffer layer. In an embodiment, the method may include etching the buffer layer to expose the first connectors. In an embodiment, following etching the buffer layer, a portion of the buffer layer remains on a sidewall of the first connectors. In an embodiment, the method may include attaching a third die adjacent to the second die, the first die routing signals between the second die and the third die. In an embodiment, the buffer layer may include a different material than an adjacent upper layer of the first redistribution structure.

Another embodiment is a device including an interposer having a redistribution structure, the redistribution structure including metallization lines embedded in a first dielectric layer. The device also includes a first die attached to the interposer at a first side of the interposer. The device also includes a package substrate attached to the interposer at a second side of the interposer, opposite the first side. The device also includes an underfill material interposed between the package substrate and the redistribution structure, the underfill contacting portions of the first dielectric layer and portions of a second dielectric material disposed in depressions of the first dielectric layer.

In an embodiment, the device may include a local silicon interconnect embedded in the interposer, the local silicon interconnect laterally surrounded by a first encapsulant. In an embodiment, the device may include a second encapsulant laterally surrounding the first die. In an embodiment, the device includes a conductive feature over the redistribution structure, the conductive feature electrically coupled to the package substrate, and the second dielectric material contacts a sidewall of the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a first package component, comprising:
      forming a first interconnect over a first carrier,
      forming electrical connectors over the first interconnect,
      depositing a buffer layer over the electrical connectors, the buffer layer burying the electrical connectors, wherein the buffer layer is comprised of a first material, wherein an upper dielectric layer of the first interconnect is comprised of a second material, wherein the second material is different from the first material, attaching a second carrier to the buffer layer, and removing the first carrier;

attaching a chip to a side of the first interconnect opposite the buffer layer;

laterally encapsulating the chip in an encapsulant;

debonding the second carrier;

removing at least a first portion of the buffer layer to expose the electrical connectors; and singulating a first package device from the first package component, the first package component including the chip.

2. The method of claim 1, wherein the encapsulant is a second encapsulant, the method further comprising:

prior to forming the first interconnect, attaching a discrete die over the first carrier; and encapsulating the discrete die in a first encapsulant.

3. The method of claim 2, wherein the discrete die is a local silicon interconnect die.

4. The method of claim 1, further comprising:

disposing a film on wire (FoW) layer between the buffer layer and the second carrier; and following debonding the second carrier, removing the FoW layer from the buffer layer.

5. The method of claim 4, wherein a thickness of the FoW layer is between 2 and 3 times a maximum topography of an upper surface of the buffer layer.

6. The method of claim 1, further comprising:

following removing at least the first portion of the buffer layer, a second portion of the buffer layer remains in a depression in an upper surface of the electrical connectors; and etching the second portion of the buffer layer in the depression of the upper surface of the electrical connectors, the etching recessing an upper surface of the first interconnect.

7. The method of claim 1, wherein prior to depositing the buffer layer, an average upper surface topography is between about 20 and 30 µm, wherein after depositing the buffer layer, the average upper surface topography is between 3 and 7 µm.

8. The method of claim 1, further comprising:

forming conductive connectors over the electrical connectors; and attaching a prepared substrate to the conductive connectors, wherein following attaching the prepared substrate, a remnant of the first material is interposed between the prepared substrate and the first interconnect.

9. A method comprising:

attaching a first die to a first carrier;

forming a metal pillar on the first carrier;

encapsulating the first die and metal pillar in a first encapsulant;

forming a first redistribution structure over the first encapsulant;

forming first connectors over the first redistribution structure, wherein following forming the first connectors, an upper surface of the first redistribution structure together with the first connectors has a first average topography;

forming a buffer layer over the first redistribution structure and the first connectors, an upper surface of the buffer layer having a second average topography, the second average topography being less than half of the first average topography;

disposing an epoxy film on the buffer layer;

performing a carrier switch process to a second carrier, wherein the epoxy film is between the second carrier and the buffer layer; and attaching a second die on a side of the first encapsulant opposite the first redistribution structure.

10. The method of claim 9, further comprising:

removing the second carrier; and etching the epoxy film to remove the epoxy film from over the buffer layer.

11. The method of claim 9, further comprising:

etching the buffer layer to expose the first connectors.

12. The method of claim 11, wherein following etching the buffer layer, a portion of the buffer layer remains on a sidewall of the first connectors.

13. The method of claim 9, further comprising:

attaching a third die adjacent to the second die, the first die routing signals between the second die and the third die.

14. The method of claim 9, wherein the buffer layer comprises a different material than an adjacent upper layer of the first redistribution structure.

15. A method comprising:

forming first connectors over a first structure, wherein after forming the first connectors, an upper surface of the first structure together with the first connectors has a first average topography;

forming a buffer layer over the first structure and the first connectors, an upper surface of the buffer layer having a second average topography, the second average topography being less than half of the first average topography, wherein the buffer layer completely covers the first connectors;

attaching a carrier to the buffer layer, wherein the buffer layer completely covers the first connectors after attaching the carrier;

removing the carrier to expose the buffer layer; and after removing the carrier, removing at least a portion of the buffer layer to expose the first connectors.

16. The method of claim 15, wherein the first structure comprises a first redistribution structure.

17. The method of claim 15, further comprising:

forming the first structure, comprising:

forming a first interconnect over a first carrier substrate;

attaching a first die over the first interconnect;

forming an encapsulant along sidewalls of the first die; and forming a second interconnect over the encapsulant, wherein the first connectors are electrically coupled to corresponding conductive features of the second interconnect.

18. The method of claim 15, wherein removing at least the portion of the buffer layer exposes sidewalls of the first connectors.

19. The method of claim 17, wherein the first die is a local silicon interconnect die.

20. The method of claim 15, wherein the first structure includes an uppermost layer, wherein the uppermost layer is a dielectric layer, wherein the buffer layer is formed on the uppermost layer, wherein the buffer layer is a different material than the uppermost layer.

* * * * *